United States Patent
Hirai

(10) Patent No.: US 7,713,578 B2
(45) Date of Patent: May 11, 2010

(54) METHOD FOR FABRICATING THIN FILM PATTERN, METHOD FOR FABRICATING DEVICE, ELECTRO-OPTICAL APPARATUS, AND ELECTRONIC APPARATUS

(75) Inventor: Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1326 days.

(21) Appl. No.: 10/849,235

(22) Filed: May 20, 2004

(65) Prior Publication Data

US 2005/0007398 A1    Jan. 13, 2005

(30) Foreign Application Priority Data

May 30, 2003 (JP) ............................. 2003-155861
Mar. 29, 2004 (JP) ............................. 2004-094527

(51) Int. Cl.
*G03F 9/00* (2006.01)
(52) U.S. Cl. .................................................. 427/125
(58) Field of Classification Search ................. 427/58, 427/256, 125, 23, 180
See application file for complete search history.

(56) References Cited

U.S. PATENT DOCUMENTS

| 5,132,248 | A | 7/1992 | Drummond et al. |
| 5,469,278 | A * | 11/1995 | Takahara et al. .............. 349/86 |
| 6,194,837 | B1 * | 2/2001 | Ozawa .................... 315/169.1 |
| 6,294,401 | B1 | 9/2001 | Jacobson et al. |
| 6,503,772 | B1 | 1/2003 | Ohtsu et al. |
| 6,770,904 | B2 * | 8/2004 | Ong et al. ...................... 257/40 |
| 7,015,503 | B2 | 3/2006 | Seki et al. |
| 7,214,959 | B2 | 5/2007 | Seki et al. |
| 7,273,801 | B2 | 9/2007 | Seki et al. |
| 2002/0067123 | A1 * | 6/2002 | Seki et al. .................... 313/504 |
| 2002/0067400 | A1 | 6/2002 | Kawase et al. |
| 2002/0136823 | A1 * | 9/2002 | Miyashita et al. ............. 427/66 |
| 2002/0195932 | A1 * | 12/2002 | Steckl et al. ................. 313/509 |
| 2003/0003231 | A1 | 1/2003 | Kiguchi et al. |
| 2003/0030689 | A1 | 2/2003 | Hashimoto et al. |
| 2003/0044645 | A1 * | 3/2003 | Kambe et al. ................ 428/690 |
| 2003/0102472 | A1 * | 6/2003 | Kelley et al. ................... 257/40 |
| 2004/0079254 | A1 | 4/2004 | Hasei |
| 2004/0209190 | A1 | 10/2004 | Mori et al. |
| 2005/0186403 | A1 | 8/2005 | Seki et al. |

FOREIGN PATENT DOCUMENTS

| CN | 1258428 A | 6/2000 |
| EP | 0 930 641 A2 | 7/1999 |
| EP | 1 208 985 A2 | 5/2002 |
| EP | 1 345 261 A1 | 9/2003 |
| GB | 2 330 451 A | 4/1999 |
| JP | A 59-75205 | 4/1984 |
| WO | WO 91/14015 | 9/1991 |
| WO | WO 02/052627 A1 | 7/2002 |

* cited by examiner

*Primary Examiner*—Michael Cleveland
*Assistant Examiner*—Tabassom Tadayyon Eslami
(74) *Attorney, Agent, or Firm*—Oliff & Berridge, PLC

(57) ABSTRACT

A method for fabricating a thin film pattern on a substrate includes a bank forming step of forming banks in a predetermined pattern on said substrate, a first material disposing step of disposing first liquid droplets made of a function liquid between said banks to form a first pattern, a second material disposing step of disposing second liquid droplets made of a function liquid on said first pattern, and an intermediate drying step of removing at least a part of a solvent contained in said first liquid droplets between said first material disposing step and said second material disposing step.

26 Claims, 13 Drawing Sheets

METHOD FOR FABRICATING THIN FILM PATTERN, METHOD FOR FABRICATING DEVICE, ELECTRO-OPTICAL APPARATUS, AND ELECTRONIC APPARATUS

BACKGROUND OF THE INVENTION

1. Field of the Invention

The present invention relates to a method for fabricating a thin film pattern, a method for manufacturing a device, an electro-optical apparatus, and an electronic apparatus.

Priority is claimed on Japanese Patent Application No. 2003-155861, filed May 30, 2003, and Japanese Patent Application No. 2004-94527, filed Mar. 29, 2004, the contents of which are incorporated herein by reference.

2. Description of Related Art

A photolithography process is used in manufacturing a device with lines (wiring) such as electronic circuits and integrated circuits. In this photolithography process, line patterns of thin films are formed by applying a photosensitive material, a so-called resist, on a conductive film preliminarily applied on a substrate, irradiating the resist in a circuit pattern and developing, and etching the conductive film in the resist pattern. In this photolithography process, large facilities such as vacuum equipment and complicated processes are necessary, efficiencies in the use of materials are around a few percent, that is, most of the materials is discarded, and production costs are high.

In contrast, a method in which patterns of lines are formed on a substrate using a liquid droplet ejecting process (method) in which liquid droplets of a liquid material are ejected from a liquid droplet ejecting head, or a so-called ink-jet process, is proposed (refer to, e.g., U.S. Pat. No. 5,132,248). In this method, an ink for forming line patterns, in which conductive fine particles such as metal fine particles are dispersed and which is a function liquid, is directly applied to the substrate in a pattern, and the ink is transformed into a conductive thin film pattern using a subsequent heat (thermal) treatment or a subsequent laser irradiation. This method has advantages in that a photolithography process is unnecessary, processes are relatively simple, and less raw material is needed.

In the case of forming a thick film pattern using a liquid droplet ejecting process, a method in which a larger-size droplet is ejected can be conceived, but this method has disadvantages such as generation of puddles (bulges) of liquid.

The present invention was conceived in view of the above circumstances, and an object of the present invention is to provide a method for fabricating a thin film pattern with a desired thickness in fabricating a thin film pattern such as lines on a substrate using a liquid droplet ejecting process, a method for manufacturing a device, an electro-optical apparatus, and an electronic apparatus.

SUMMARY OF THE INVENTION

In order to attain the above object, the present invention adopts the following constitutions.

The present invention provides a method for fabricating a thin film pattern on a substrate including a bank forming step of forming banks in a predetermined pattern on the substrate, a first material disposing step of disposing first liquid droplets made of a function liquid between the banks to form a first pattern, a second material disposing step of disposing second liquid droplets made of a function liquid on the first pattern, and an intermediate drying step of removing at least a part of a solvent contained in the first liquid droplets between the first material disposing step and the second material disposing step.

According to the present invention, since the first liquid droplets made of a function liquid are disposed on the substrate at the first material disposing step, an intermediate drying treatment is performed on the function liquid on the substrate to dry the function liquid (film pattern), and then, the second liquid droplets made of the next function liquid are disposed on this dried function liquid at the second material disposing step, the second liquid droplets are disposed smoothly on the film of the function liquid formed by the intermediate drying treatment on the substrate. By repeatedly performing this treatment several times, a thick film pattern can be formed smoothly with a predetermined thickness. In addition, since the function liquid are disposed between the banks standing on the substrate in order to form the film pattern, the film pattern with a predetermined shape can be smoothly patterned along the shapes of the banks.

At the intermediate drying step, it is sufficient that at least a part of liquid components contained in the function liquid (first liquid droplets) previously disposed on the substrate is removed, and it is not necessary to remove all the liquid components, but all the liquid components may be removed.

The present invention provides a method for fabricating a thin film pattern on a substrate including a bank forming step of forming banks in a predetermined pattern on the substrate, a first material disposing step of disposing first liquid droplets made of a function liquid between the banks to form a first pattern, and a second material disposing step of disposing second liquid droplets made of a function liquid on the first pattern, wherein an intermediate drying step of removing at least a part of a liquid component contained in the first liquid droplet in tandem with at least one of the first material disposing step and the second material disposing step, is performed.

Instead of a constitution in which the intermediate drying treatment is wholly performed to all the liquid droplets disposed on the substrate, the intermediate drying step can be performed with disposing the first liquid droplets (in tandem with disposing the first liquid droplets), or the intermediate drying step can be performed with disposing the second liquid droplets. The film thickness of the pattern can be smoothly increased by using this constitution. The intermediate drying step with disposing the liquid droplets can be performed in tandem with both of the first and second material disposing steps, or with one of the first material disposing step and the second material disposing step.

The method for fabricating a thin film pattern according to the present invention can further include a third material disposing step of disposing third liquid droplets made of a function liquid on the function liquid disposed on the substrate, before or after the second material disposing step. The function liquids can be sequentially disposed using several material disposing steps including the first, second and third material disposing steps. In this case, the intermediate drying step can be set up between optional two successive material disposing steps of those material disposing steps or in tandem with optional material disposing steps.

The intermediate drying step can include a heat treatment process or an light irradiation treatment process to dry suitably the function liquids disposed on the substrate. The content of the liquid components left in the function liquids on the substrate can be easily adjusted by conditions for the heat treatment process or an light irradiation treatment process.

In the method for fabricating a thin film pattern according to the present invention, after the intermediate drying step, a liquid-repelling process, in which the banks are made to be liquid-repellent, can be performed. According to the present invention, on disposing the liquid droplets of the function liquids between the banks, some of the liquid droplets ejected may make contact with, a part of the bank e.g., its upper surface, and therefore, the liquid-repellency of those surfaces at this part may become lowered. In this case, when next ejected liquid droplets of the function liquids put on the part, the liquid droplets cannot flow down smoothly and may damage the film pattern. However, since the banks have liquid repellency by performing the liquid-repelling step before the next material disposing step to apply the liquid-repellency to the banks, even though a part of the liquid droplet ejected is placed on the banks, it is repelled from the banks because of the liquid repellency of the banks and flows down to a bottom between the banks. Thereby, the ejected function liquid can be positioned suitably between the banks on the substrate. As a liquid-repelling step, a plasma treatment using a treatment gas including a tetrafluoromethane ($CF_4$) can be used. By using this treatment, a fluorine group can be introduced into the banks, and therefore, the banks can have liquid-repellency against the function liquid.

In the method for fabricating a thin film pattern according to the present invention, the function liquids used in the material disposing steps are mutually different. According to this method, a layered body (stack) of a plurality of film patterns having various kinds of function can be formed. In addition, if liquid droplets of the same material are disposed every material disposing step, the film thickness of the pattern formed of function material contained in the function liquid can be smoothly increased. In the case in which the function liquids used in the material disposing steps are mutually different, a first function material contained in the function liquid disposed at the first material disposing step can be used as a material for forming a adhesive layer between a second function material, which contained in the function liquid disposed at the second material disposing step, and the substrate.

A liquid component (solvent) contained used at the first material disposing step and a liquid component (solvent) contained used at the second material disposing step may be the same or mutually different. The solvents are preferably the same because the affinity between the function liquids deposited or stacked is high. However, the solvents may be different if a desired affinity is attained.

In the method for fabricating a thin film pattern according to the present invention, the function liquids can include conductive particles. In addition, the function liquids can include materials which can exhibit conductivity by heat treatment or light irradiation treatment. The present invention can be applied to various devices by using the film patterns as line patterns or wiring patterns. If materials for forming light emitting elements used in organic EL and the like or ink materials R, G and B, in addition to the conductive particles, are used, the present invention can be applied to an organic EL device and a liquid crystal display device and the like.

A method for manufacturing an active matrix substrate according to the present invention includes a step of fabricating a thin film pattern on a substrate, wherein a thin film pattern is formed on a substrate by a method for fabricating a thin film pattern according to the method for fabricating a thin film pattern, which is described above.

According to the present invention, a thick film pattern can be formed smoothly with a predetermined thickness. In addition, since the function liquid is disposed between the banks standing on the substrate in order to form the film pattern, the film pattern with a predetermined shape can be smoothly patterned along the shapes of the banks. Therefore, an active matrix substrate with a predetermined performance can be manufactured.

A method for manufacturing an active matrix substrate according to the present invention includes a first step of forming gate lines on a substrate, a second step of forming a gate insulating film on the gate lines, a third step of depositing a semiconductor layer on the gate lines through the intervention of the gate insulating film, a fourth step of forming source electrodes and drain electrodes on the gate insulating film, a fifth step of disposing insulating materials on the source electrodes and the drain electrodes, a sixth step of forming pixels electrodes with an electrical connection to the drain electrodes, wherein at least one of the first step, the fourth step, and the sixth step includes a step of forming banks depending on a formation pattern, a first material disposing step of disposing first liquid droplets between the banks to form a first pattern, a second material disposing step of disposing second liquid droplets on the first pattern, and an intermediate drying step of removing at least a part of a solvent included in the first liquid droplets between the first material disposing step and the second material disposing step.

According to the present invention, a thick film pattern can be formed smoothly with a predetermined thickness. In addition, since the function liquid are disposed between the banks standing on the substrate in order to form the film pattern, the film pattern with a predetermined shape can be smoothly patterned along the shapes of the banks. Therefore, an active matrix substrate with a predetermined performance can be manufactured.

A method for manufacturing an active matrix substrate according to the present invention includes, a first step of forming gate lines on a substrate, a second step of forming a gate insulating film on the gate lines, a third step of depositing a semiconductor layer on the gate lines through the intervention of the gate insulating film, a fourth step of forming source electrodes and drain electrodes on the gate insulating film, a fifth step of disposing insulating materials on the source electrodes and the drain electrodes, a sixth step of forming pixels electrodes with an electrical connection to the drain electrodes, wherein at least one of the first step, the fourth step, and the sixth step includes a step of forming banks depending on a formation pattern, a first material disposing step of disposing first liquid droplets between the banks to form a first pattern, a second material disposing step of disposing second liquid droplets on the first pattern, and performing an intermediate drying step of removing at least a part of a liquid component included in the first liquid droplet in tandem with at least one of the first material disposing step and the second material disposing step.

According to the present invention, a thick film pattern can be formed smoothly with a predetermined thickness. In addition, since the function liquid are disposed between the banks standing on the substrate in order to form the film pattern, the film pattern with a predetermined shape can be smoothly patterned along the shapes of the banks. Therefore, an active matrix substrate with a predetermined performance can be manufactured.

A method for manufacturing a device, according to the present invention, includes a step of fabricating a thin film pattern on a substrate, wherein the thin film pattern formed on the substrate by the method for fabricating a thin film pattern, which is described above. According to the present invention, a device having film patterns with a desired pattern shape and a predetermined thickness can be obtained.

An electro-optical apparatus according to the present invention includes a device manufactured by a method for manufacturing a device which is described above. An electronic apparatus according to the present invention includes an electro-optical apparatus described above. According to the present invention, an electro-optical apparatus and an electronic apparatus having line patterns with a predetermined thickness can be obtained.

DETAILED DESCRIPTION OF THE INVENTION

Figure 1:
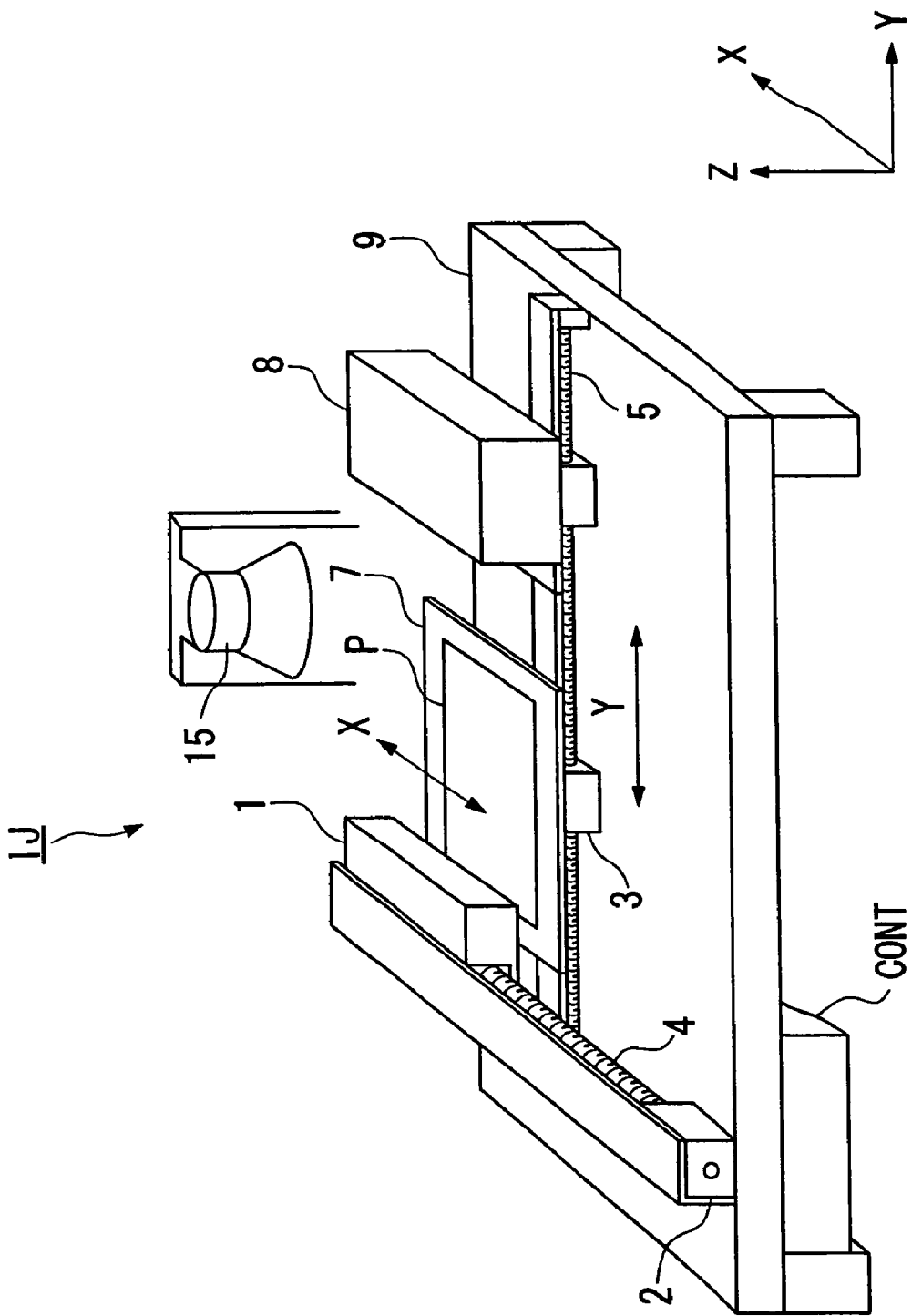
FIG. 1 is a schematic perspective view of a liquid droplet ejecting apparatus.

An embodiment of a method for fabricating a thin film pattern on a substrate and a method for manufacturing a device, according to the present invention, will be explained with reference to the figures. As an example of this embodiment, a case in which an ink (function liquid) for forming patterns of lines (patterns of thin films), in which conductive fine particles are included, is ejected on a substrate in the form of liquid droplets from nozzles of an ejecting head using a liquid droplet ejecting process, and line patterns formed of conductive films on the substrate, will be explained.

First, an ink (function liquid) which is used is explained. The ink for line patterns of a liquid material, is made of a dispersion liquid, which includes a dispersion medium and conductive fine particles that are dispersed in the dispersion medium, or a solution in which organosilver compound or silver oxide nanometer particles are dispersed (or dissolved) in a solvent (dispersion medium). In the present embodiment, the conductive fine particles may be fine particles including one of gold, silver, copper, aluminum, palladium, manganese, nickel, and their oxides as well as fine particles of conductive polymers, or fine particles of a superconductor. The sizes of the conductive fine particles may preferably be set in a range between 1 nm and 0.1 μm. When the sizes of the conductive fine particles are set to be greater than 0.1 μm, the nozzles of the liquid ejecting head may become clogged. When the sizes of the conductive fine particles are set to be less than 1 nm, the volume ratio of the coating material with respect to the conductive fine particles is increased, and a content of an organic substance contained in the obtained film may be too high.

The dispersion medium is not limited to a specific type as long as it is possible to disperse the conductive fine particles without causing aggregation. The dispersion medium may be, for example, other than water, an alcohol such as methanol, ethanol, propanol, or butanol; a hydrocarbon compound such as n-heptane, n-octane, decane, dodecane, tetradecane, toluene, xylene, cymene, durene, indene, dipentene, tetrahydronaphthalene, decahydronaphthalene, or cyclohexylbenzene; an ether compound such as ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, 1,2-dimethoxyethane, bis(2-methoxyethyl) ether, or p-dioxane; or a polar compound such as propylene carbonate, γ-butyrolactone, N-methyl-2-pyrrolidone, dimethyl formamide, dimethyl sulfoxide, or cyclohexanone. In the above group, water, an alcohol, a hydrocarbon compound, and an ether compound are preferred, and more preferred dispersion mediums are water and a hydrocarbon compound in view of the dispersion performance of the fine particles, stability of the dispersion liquid, and ease of application to a liquid droplet ejecting method.

The surface tension of the dispersion liquid containing the conductive fine particles may preferably be set in a range between 0.02 N/m and 0.07 N/m. In the case in which liquid is ejected using a liquid droplet ejecting method, when the surface tension is set to be less than 0.02 N/m, the trajectory of the liquid tends to be deflected because the wettability of the ink with respect to the nozzle surface is increased, and when the surface tension is set to be greater than 0.07 N/m, it is difficult to control the amount of ejection and the timing of ejection because the shape of the meniscus at the nozzle end is not stable. In order to adjust the surface tension, a very small amount of a surface tension modifier such as one of a fluorine type, silicone type, or nonion type may preferably be added to the dispersion liquid to an extent that does not significantly decrease the contact angle with respect to the substrate. The surface tension modifier of a nonion type improves wettability of the liquid with respect to the substrate, and contributes to the prevention of small irregularities in a film. The dispersion liquid may include organic compounds such as alcohol, ether, ester, or ketone, if necessary.

The viscosity of the dispersion liquid may preferably be set in a range between 1 mPa·s and 50 mPa·s. In the case in which an ink is ejected as liquid droplets using a liquid droplet ejecting method, when the viscosity is less than 1 mPa·s, portions around the nozzles tend to become contaminated due to ejected ink, and when the viscosity is greater than 50 mPa·s, the nozzles may frequently become clogged, and it is difficult to smoothly perform ejection of the droplets.

As a substrate on which a pattern of lines is formed, various types of material may be used such as glass, silica glass, a silicon wafer, a plastic film, or a metal plate. The substrate may be of a type having a base substrate and a foundation layer such as a semiconductive film, a metal film, a dielectric film, or an organic film that is formed on the base substrate.

Various kinds of ejecting methods such as a charge control method, a pressure vibration method, an electromechanical conversion method, an electrothermal conversion method, and an electrostatic attraction method are used in liquid droplet ejecting processes. In the charge control method, charges are applied to materials at a charged electrode, and the charged materials are ejected from an ejecting nozzle with its ejecting direction with being controlled by deflecting electrodes. In the pressure vibration method, materials are pushed to a nozzle of an ejecting head by applying a ultra-high pressure of about 30 kg/cm$^2$, and the materials are ejected straight from an ejecting nozzle in the case of applying no control voltage, and, on the other hand, the materials are not ejected from an ejecting nozzle in the case of applying a control voltage because the materials are disaggregated due to an electrostatic repulsion between the materials. In the electromechanical conversion method, which utilizes deformability of a piezoelectric element due to an electrical signal pulse, a pressure is applied to a space with materials therein through a flexible material by the deformation of the piezoelectric element and the materials are pushed out from the space to be ejected from an ejecting nozzle.

In the electrothermal conversion method, materials are rapidly vaporized and bubbles are produced by a heater provided in a space with materials therein, and the materials in the space are ejected by pressure of bubbles. In the electrostatic attraction method, a very small pressure is applied to a space with materials therein to form a meniscus of materials at the ejecting nozzle, and the materials in the form of the meniscus are pulled out by an electrostatic attraction. In addition, other methods such as a method utilizing viscous deformation of a fluid due to an electric field and a method for ejecting materials by utilizing discharge sparks may be applied. The liquid droplet ejecting method has an advantage in which a material may be used with less loss, and it is possible for a desired quantity of a material to be precisely disposed at desired positions. In the liquid droplet ejecting method, the weight of a single droplet of a liquid material ejected is, for example, 1 to 300 nanograms.

Next, a manufacturing device for manufacturing a device according to the present invention is explained. A liquid droplet ejecting device (ink-jet device) is used as this manufacturing device, and that is, a device is manufactured by ejecting (dripping) liquid droplets on a substrate by a nozzle for ejecting liquid droplets.

FIG. 1 is a perspective view showing a schematic constitution of a liquid droplet ejecting device IJ. In FIG. 1, the liquid droplet ejecting device IJ includes a liquid droplet ejecting head 1, an x-axis drive shaft 4, a y-axis guide shaft 5, a control device CONT, a stage 7, a cleaning mechanism 8, a base 9, and a heater 15.

The stage 7 supports a substrate P on which an ink is disposed using this liquid droplet ejecting device IJ, and includes a fixing mechanism (not shown) by which the substrate P is fixed to a reference position.

The liquid droplet ejecting head 1, a longitudinal direction of which coincides with the x-axis, is a multi-nozzle type liquid droplet ejecting head with a plurality of ejecting nozzles. The plurality of ejecting heads are provided on the undersurface of the liquid droplet ejecting head 1 with a uniform space along the x-axis. An ink containing conductive fine particles described above therein are ejected onto the substrate P supported by the stage 7 from the ejecting nozzles of the liquid droplet ejecting head 1.

An x-axis drive motor 2 is connected to the x-axis drive shaft 4. The x-axis drive motor 2, which is a stepping motor or the like, rotates the x-axis drive shaft 4 upon receiving a x-axis driving signal from the control device CONT. When the x-axis drive shaft 4 is rotated, the liquid droplet ejecting head 1 moves along the x-axis.

A y-axis guide shaft 5 is fixed with the reference to the base 9. The stage 7 includes a y-axis drive motor 3. The y-axis drive motor 3, which is a stepping motor or the like, moves the stage 7 along the y-axis upon receiving a y-axis driving signal from the control device CONT.

The control device CONT supplies a voltage to the liquid droplet ejecting head 1 for controlling an ejection of a liquid droplet. Additionally, the control device CONT supplies driving pulse signals for controlling a movement of the liquid droplet ejecting head 1 along the x-axis with reference to the x-axis drive motor 2, and supplies driving pulse signals for controlling a movement of the stage 7 along the y-axis with reference to the y-axis drive motor 3.

The cleaning mechanism 8 is provided for cleaning the liquid droplet ejecting head 1 and includes a y-axis drive motor (not shown). The cleaning mechanism 8 is moved by the y-axis drive motor along the y-axis guide shaft 5. The movement of the cleaning mechanism 8 is controlled by the control device CONT.

The heater 15 is a heating means for applying a heat treatment process to the substrate P, e.g., by a lamp annealing device, in which liquid materials applied onto the substrate P are vaporized and dried. The turning on and off of this heater is also controlled by the control device CONT.

In the liquid droplet ejecting device IJ, liquid droplets are ejected onto the substrate P, while relatively scanning the liquid droplet ejecting head 1 and the stage 7 with the substrate P thereon. In the following explanation, it is assumed that the y-axis is a scanning direction, and the x-axis perpendicular to the y-axis is a non-scanning direction. The ejecting nozzles of the liquid droplet ejecting head 1 are provided with a uniform space along the x-axis, that is, the non-scanning direction. In FIG. 1, the liquid droplet ejecting head 1 is arranged perpendicular to the direction of movement of the substrate P; however, the angle of the liquid ejecting head 10 may be adjusted so that the liquid ejecting head 1 is obliquely arranged with respect to the direction of movement of the substrate P. In such an arrangement, the pitch between nozzles of the liquid ejecting head 1 can be changed by adjusting the angle of the liquid ejecting head 1. Moreover, a configuration may be employed in which the distance between the substrate P and a nozzle face of the liquid ejecting head 1 can be freely adjusted.

Figure 2:
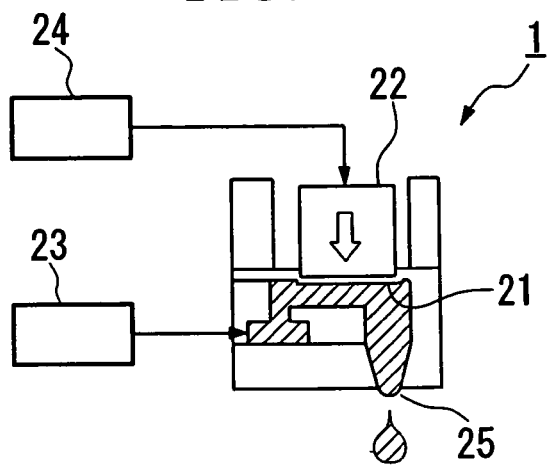
FIG. 2 is a diagram for explaining an ejecting principle of a liquid material by a piezoelectric system.

FIG. 2 is a schematic illustration to explain a principle of ejection of liquid materials in a piezo-jet method. In FIG. 2, a piezoelectric element 22 is provided adjacent to a chamber 21 for housing liquid materials (ink for forming a pattern of lines or function liquid). Liquid materials are supplied to the chamber 21 through a liquid material supplying system 23 including a tank for accommodating liquid materials. The piezoelectric element 22 is connected to a drive circuit 24, and therefore, by applying a voltage to the piezoelectric element 22 through the drive circuit 24 to deform the piezoelectric element 22, the chamber 21 is deformed and therefore liquid materials are ejected from an ejecting nozzle. In this case, the quantity of distortion of the piezoelectric element 22 is controlled by changing the voltage applied. The speed of distortion of the piezoelectric element 22 is controlled by changing the frequency of the voltage applied. The piezojet method has an advantage in that the composition of materials is not affected easily because heat is not applied to the materials on ejecting liquid droplets.

Figure 3:
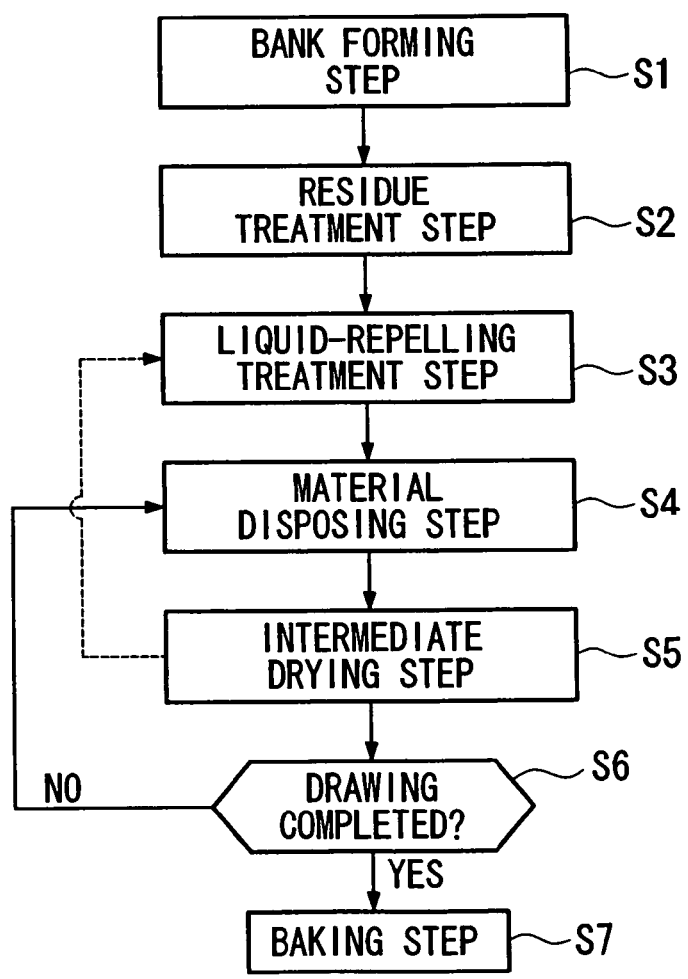
FIG. 3 is a flow chart showing the procedure of forming a wiring pattern according to the present invention.

Next, an embodiment of a method for fabricating line patterns according to the present invention is explained in reference to FIGS. 3, 4 and 5. FIG. 3 is a flow chart showing an example of a method for fabricating line patterns of the present embodiment, FIGS. 4 and 5 are schematic illustrations showing procedures of fabricating. As shown in FIG. 3, a method for fabricating line patterns of the present embodiment, in which an ink for fabricating line patterns described above is disposed on a substrate and line patterns made of conductive films are formed on the substrate, includes a bank forming step S1 of forming banks on the substrate in a predetermined pattern depending on the line patterns, residue treatment step S2 of removing residue between the banks, a liquid-repelling treating step S3 of making the banks liquid-repellent, a material disposing step (first material disposing step) S4 of disposing an ink(first liquid droplets) between the banks, in which the residues therein are removed, to form a first pattern, an intermediate drying step S5 of removing at least a part of a liquid component contained in the ink, and a baking (heating) step S7, wherein whether lithography of a predetermined pattern is completed or not is judged after the intermediate drying step S5 (step S6), the baking step S7 is carried out if the pattern lithography is completed, and a material disposing step (second material disposing step) S4 of disposing an ink (second liquid droplets) the pattern (first pattern) formed between the banks on the substrate is carried out if the pattern lithography is not completed, that is, this ink is disposed on the ink previously disposed on the substrate. Each step is explained in detail as follows. In this embodiment, a glass substrate is used as the substrate P.

Bank Forming Step

Figure 4A:
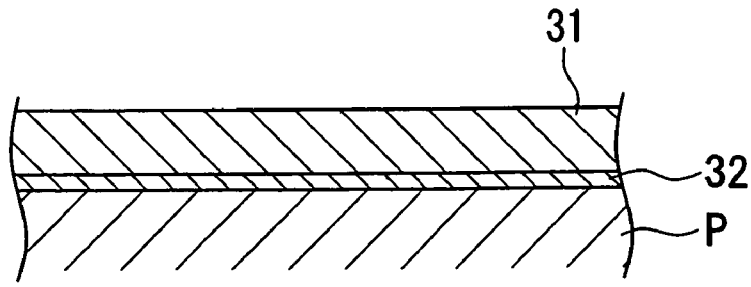
FIGS. 4A to 4D show an example of the procedure of forming a film pattern according to the present invention.

First, an HMDS treatment is taken to the substrate P as a surface modification treatment before applying organic materials. The HMDS treatment is a method in which hexamethyldisilazane $((CH_3)_3SiNHSi(CH_3)_3)$ vapor is applied. According to this method, as shown in FIG. 4A, a HDMS layer 32 is formed on the substrate P as an adhesion layer of improving the adhesion between the bank and the substrate P.

Figure 4B:
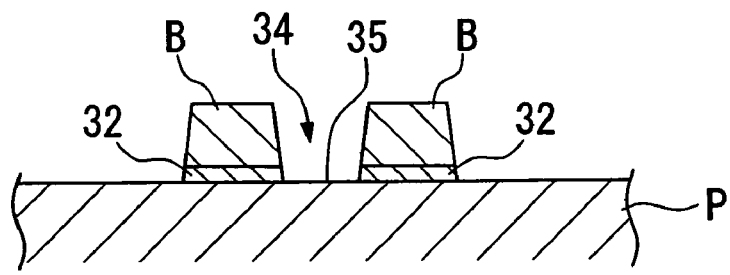

The banks, which act as partitions, can be formed by various methods such as photolithography and a printing process. For example, in the case of the use of the photolithography, using prescribed methods such as the spin coat process, the spray coat process, the roll coat process, the die coat process, and the dip coat process, organic photosensitive materials 31 are applied on the HDMS layer 32 formed on the substrate P in height with the banks, and a resist layer is applied thereon. A part of the resist which fits the shapes of the banks is made to remain by irradiating and developing the resist using a mask adapted for the shapes of the banks (line pattern). Bank materials besides bank materials which are masked are removed by etching. The bank may be formed by more than two layers, e.g., a lower layer which is made of an inorganic or organic material and a material having liquid-affinity to the function liquid, and an upper layer which is made of an organic material and a liquid-repellent material. Finally, banks B and B are formed in a protruding condition so as to surround regions in which line patterns are expected to be formed, as shown in FIG. 4B.

As organic materials for forming the banks, materials having liquid-repellency with respect to liquid materials or as described below, insulating organic materials, which can be liquid-repellent (fluorinated) by a plasma treatment, well-adhesive with a base substrate and easily patterned by photolithography, may be used. For example, polymer materials such as aclylic resin, polyimide resin, olefin resin, phenol resin, and melanin resin can be used.

Residue Treatment Step

After the banks are formed on the substrate P, a hydrofluoric acid treatment is performed. The hydrofluoric acid treatment is a treatment in which the HMDS layer 32 between the banks B and B is removed by etching e.g., with a 2.5% hydrofluoric acid solution. In the hydrofluoric acid treatment, the banks B and B act as a mask, parts of the HMDS layer 32 which are organic materials and located at the bottom 35 in a grove 34 formed between the banks B and B, and thereby the HMDS as the residue are removed.

In some cases, HMDS (organic materials), which are located at the bottom 35 between the banks B and B, are not completely removed. In other cases, parts of the resist (organic materials), which are located at the bottom 35 between the banks B and B on the formation of the banks, remain. For this reason, next, a residue treatment is applied to the substrate P in order to remove organic residue (resist and HMDS), which are located at the bottom 35 between the banks B and B, on the formation of the banks.

As the residue treatment, ultraviolet (UV) irradiation treatment in which residue treatment is performed by irradiating ultraviolet light, $O_2$ plasma processing in which the oxygen is used as a process gas in air, or the like can be selected. Here, the $O_2$ plasma treatment is performed.

In the $O_2$ plasma treatment, the oxygen plasma is emitted from a plasma ignition electrode to the substrate P. As conditions for the $O_2$ plasma treatment, for example, plasma power is 50 to 1000 W, an oxygen gas flow is 50 to 100 ml/min, a relative movement speed of the substrate P to a plasma ignition electrode is 0.5 to 10 mm/sec, and a substrate temperature is made to be 70 to 90° C.

In the case in which the substrate P is a glass substrate, its surface has liquid-affinity for a material for forming line patterns, but it is possible to increase the liquid-affinity of a surface (the bottom 35) of the substrate P exposed between the banks B and B by performing the $O_2$ plasma treatment or UV irradiation treatment for the residue treatment in the same way as in this embodiment. It is preferable that the $O_2$ plasma treatment or UV irradiation treatment be performed so that a contact angle to the ink located at the bottom 35 between the banks is 15° or less. In addition, by performing the $O_2$ plasma treatment on, e.g., the electrodes in an organic EL device, the work function of the electrodes can be adjusted.

Although it was explained above that the hydrofluoric acid treatment is performed as a part of the residue treatment, in the case in which the residue can be sufficiently removed by the $O_2$ plasma treatment or UV irradiation treatment, it is not necessary that the hydrofluoric acid treatment be performed. In addition, although it was explained above that one of the $O_2$ plasma treatment or UV irradiation treatment is performed as the residue treatment, both the $O_2$ plasma treatment and UV irradiation treatment may be performed in combination.

Liquid-repelling Step

Then, the liquid-repelling treatment or, liquid-repelling treatment is performed on the banks B and liquid repellency is imparted to their surfaces. As the liquid-repelling treatment, a plasma treatment method ($CF_4$ plasma treatment method), in which, for example, tetrafluoromethane is used as a treatment gas in air, can be adopted. As conditions for the $CF_4$ plasma treatment, for example, plasma power is 50 to 1000 W, a tetrafluoromethane gas flow is 50 to 100 ml/min, a transfer speed of the substrate P to a plasma ignition electrode is 0.5 to 1020 mm/sec, and a substrate temperature is made to be 70 to 90° C. Fluorocarbon type gases instead of a tetrafluoromethane (carbon tetrafluoride) gas can be used.

By performing such a liquid-repelling treatment, a fluorine group is introduced into a resin which constitutes the banks B and B and high liquid repellency is imparted to the banks B and B. In addition, although the $O_2$ plasma treatment as a liquid-affinity treatment mentioned above may be performed before the formation of the bank B. Nevertheless, since the acrylic resin, polyimide resin, or the like has a property which is more easily fluorinated (liquid-repellent) by the $O_2$ plasma pretreatment, it is preferable to perform the $O_2$ plasma treatment after the formation of the banks B and B.

In addition, exposed parts of the substrate P, on which the liquid-affinity treatment was previously performed, are affected to some degree by the liquid-repelling treatment on the banks B and B. Nevertheless, in particular, in the case in which the substrate P is made of glass and the like, the introduction of the fluorine group by the liquid-repelling treatment does not occur, and therefore, the liquid-affinity, i.e., wettability of the substrate P is not spoiled substantially. Furthermore, the liquid-repelling treatment of the banks B and B may be omitted by forming the banks B and B with a material having liquid repellency (for example, a resin material having a fluorine group).

First Material Disposing Step

Figure 4C:
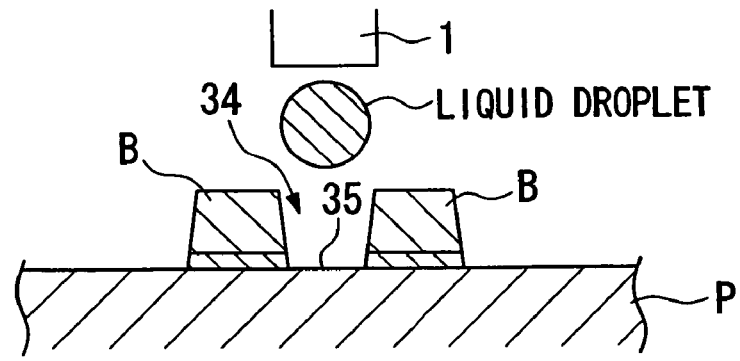
Figure 4D:
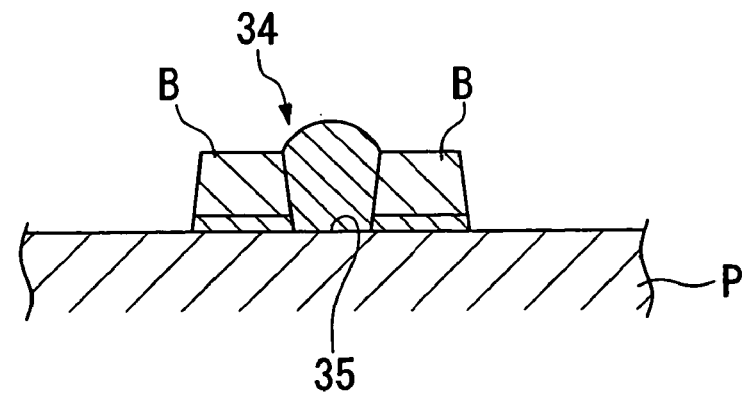

Next, liquid droplets for forming line patterns (first liquid droplets) are disposed between the banks B and B on the substrate P using the liquid droplet ejecting method by the liquid droplet ejecting apparatus IJ. The conductive fine particles may be fine particles including one of gold, silver, copper, aluminum, palladium, manganese, nickel, and their oxides as well as fine particles of conductive polymers, or fine particles of a superconductor. In this material disposing step, as shown in FIG. 4C, the ink containing the materials for forming line patterns is ejected in the form of a liquid droplet from the liquid droplet ejecting head 1. The ejected liquid droplets are located at the groove 34 between the banks B and B on the substrate P, as shown in FIG. 4D. As conditions for ejecting liquid droplets, for example, a weight of ink is 4 ng/dot, and an ink speed (ejecting speed) is 5 to 7 m/sec. In addition, it is preferable that, in an atmosphere, to which the liquid droplets are ejected, that the temperature be set to 60° C. or less and the humidity be set to 80% or less. Herewith, liquid droplets can be stably ejected without clogging of the ejecting nozzles of the liquid droplet ejecting head 1.

In this case, since regions, in which line patterns are expected to be formed (that is, the grove 34) and on which liquid droplets are ejected, are surrounded by the banks B and B, spreading of the liquid droplets to positions in addition to a predetermined position can be prevented. In addition, since the banks B have liquid repellency, even though a part of the liquid droplet ejected is placed on the banks B, it is repelled from the banks B because of the liquid repellency of the banks B and is caused to flow down to the grove between the banks. Furthermore, since the bottom 35 in the groove 34, in which the substrate P is exposed, has the liquid-affinity, the liquid droplets ejected easily spread at the bottom 35, and therefore, the ink can be arranged at predetermined positions with a uniform space.

Intermediate Drying Step

Figure 5A:
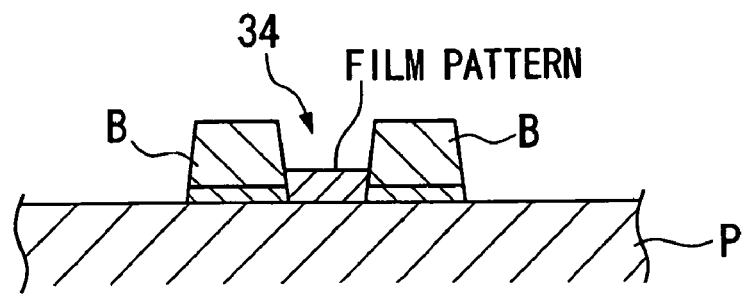
FIGS. 5A to 5D show an example of the procedure of forming a film pattern according to the present invention.

After disposing liquid droplets to the substrate P, drying treatment is performed for removing the dispersion medium as liquid component and securing a thickness of the film. It is possible to perform the drying treatment by heat treatment performed by, for example, a normal hot plate, an electric furnace, and the like which heats the substrate P. In this embodiment, for example, 180° C. heating is performed for 60 minutes, or 80° C. heating is performed for 5 minutes. This drying step is not performed necessarily in the air, but this can be performed, e.g., in a $N_2$ atmosphere. This drying step can be performed by a light irradiation treatment of lamp annealing. Although a light source of the light used for the lamp annealing is not especially limited, it is possible to use an infrared lamp, a xenon lamp, a YAG laser, an argon laser, a $CO_2$ laser, or an excimer laser, using such as XeF, XeCl, XeBr, KrF, KrCl, ArF, or ArCl, as a light source. Although light sources having the output range of 10 to 5000 W are generally used as these light sources, those having the output range of 100 to 1000 W are sufficient in this embodiment. In this intermediate drying step, at least a part of the dispersion medium is removed, and, as shown in FIG. 5A, a film pattern made of the ink is formed on the surface of the substrate.

In addition, depending on conditions for drying, the function liquid (film pattern) disposed on the substrate can be transformed to be porous. The function liquid (film pattern) disposed on the substrate P is dried e.g., by 120° C. heating for about 5 minutes or 180° C. heating for about 60 minutes, the function liquid can be transformed into a porous film pattern as the first layer. By transforming a film pattern as the first layer formed on the substrate to be porous, liquid droplets (second liquid droplets) disposed in a second material disposing step penetrate into the porous pattern, and be disposed favorably between the banks B and B.

Second Material Disposing Step

Figure 5B:
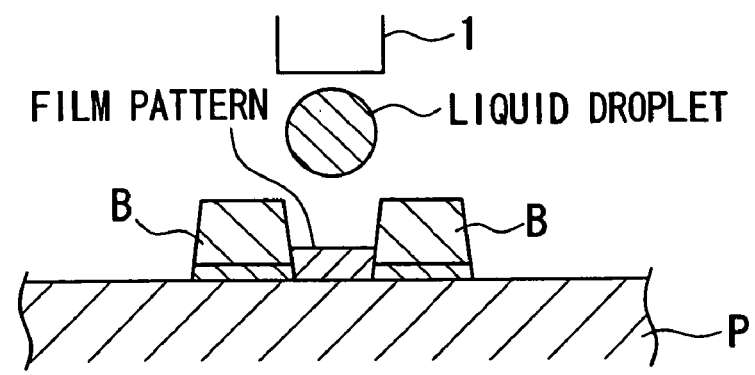
Figure 5C:
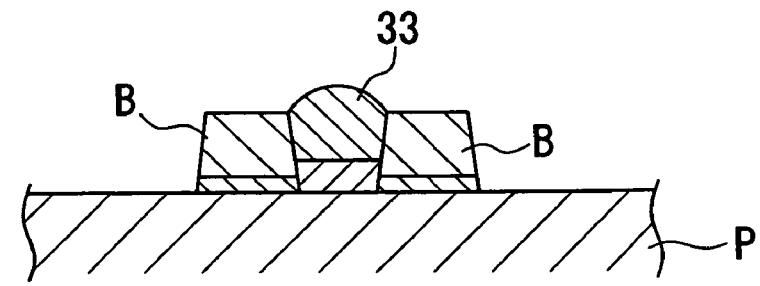

After the drying treatment is performed on the ink disposed on the substrate, the next liquid droplets of ink (second liquid droplets) are disposed on the ink (film pattern) on this substrate P, as shown in FIG 5B. The ink liquid droplets disposed from the liquid droplet ejecting head 1 wet and spread on the film pattern on the substrate P. As described above, because the first layer, i.e., the film pattern is transformed to be porous and therefore, this porous film pattern acts as a receiving film, the liquid droplets (second liquid droplets) disposed subsequently penetrate into the porous pattern, and are disposed favorably between the banks B and B.

In contrast, it is not necessary to transform the film pattern as the first layer to be porous. On this occasion, the surface of the film pattern on the substrate P dissolves again due to the ejected liquid droplets. For this reason, the ejected liquid droplets sufficiently wet and spread on the film pattern on the substrate P. By repeatedly performing this intermediate drying step and the material disposing step, two or more layers of liquid droplets of ink are deposited, and a line pattern (thin film pattern) 33 with a thick thickness is formed. Additionally, by making the first film pattern layer porous, a line pattern (thin film pattern) 33 with high compactness is formed.

Baking Process

It is necessary to remove the dispersion medium thoroughly from the dried film after the disposing step in order to improve electrical contact between fine particles. In addition, in the case in which a coating agent such as an organic substance is coated on the surfaces of the conductive fine particles in order to enhance dispersibility, it is necessary to also remove this coating agent. Therefore, the heat treatment and/or light irradiation treatment are performed to the substrate after the disposing step.

Figure 5D:
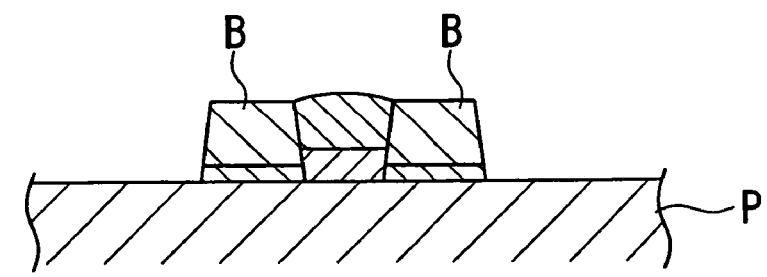

Although the heat treatment and/or light irradiation treatment are usually performed in air, they can be also performed in the atmosphere of an inert gas such as a nitrogen, argon, or helium gas, if necessary. The treatment temperature of the heat treatment and/or light irradiation treatment is suitably determined in consideration of the boiling point (vapor pressure) of the dispersion medium, the type and pressure of an atmospheric gas, thermal behaviors of fine particles such as dispersibility and oxidizability, the existence and amount of a coating agent, the heatproof temperature of a base material, and the like. For example, in order to remove the coating agent consisting of an organic substance, a baking at about 300° C. is required. In addition, in the case in which a substrate such as a plastic one is used, it is preferable to perform the baking in a range from room temperature to 100° C. After the above steps, the dried film after the disposing step is transformed into a conductive film since the electrical contact between the fine particles is secured by the above steps, as shown in FIG. 5D.

When the two or more layers of liquid droplets of ink are deposited, after the liquid droplets of ink are disposed on the substrate P and the intermediate drying step is performed, and before the next liquid droplets are disposed on the substrate P, the liquid-repelling treatment step, in which the liquid-repellency is applied to the banks B, can be performed again. The liquid droplets of ink disposed at the first material disposing step make contact with the banks, e.g., their upper surfaces, and the liquid-repellency of those surfaces may become lowered; however, by performing the liquid-repelling treatment step again before the second material disposing step to apply the liquid-repellency to the banks, liquid droplets of ink disposed at the second material disposing step can flow down smoothly within the grooves 34 on the supper surfaces of the banks B.

Although the case in which the function liquid used in the first material disposing step and the function liquid used in the second material disposing step are the same material is described above, they may be mutually different. For example, by using a function liquid including manganese and the like in the first material disposing step, and a function liquid including silver and the like in the second material disposing step, a manganese layer and a silver lay can be used as adhesive layers with the substrate.

After the baking step, the banks B located on the substrate P can be removed by an ashing removing step. A plasma ashing and an ozone ashing and the like can be adopted as an ashing removing step. In the plasma ashing, gases such as plasma oxygen gases react with the banks (resist), and the banks are vaporized to be separated or removed. The banks are made of a solid substance composed of carbon, oxygen, and hydrogen, and therefore, these components react with the plasma oxygen to become $CO_2$, $H_2O$, and $O_2$, and they can be separated entirely as gases. The basic principle of the ozone ashing is the same as that of the plasma ashing. In the ozone ashing, ozone ($O_3$) is decomposed to be transformed into O* (oxygen radical) as reactive gases, and these O* react with the banks. The banks reacted with the O* form $CO_2$, $H_2O$, and $O_2$, and they can be separated entirely as gases. The banks are removed from the substrate by performing the ashing removing step to the substrate.

As described above, on forming the line patterns by liquid droplets of ink are disposed or ejected twice and more on the grooves between the banks, the ink disposed on the substrate is dried before each ejection of the second ejection and the later ejection of the liquid droplets, and then, the ink is ejected. For this reason, the next ink is disposed smoothly on the film pattern (ink) on the substrate. By repeatedly performing this process, a thick film of the line pattern with a desired thickness can be realized smoothly.

Although the above embodiment, in which the function liquids are disposed between the banks on the substrate using the first and second material disposing steps, is described above, function liquids can be sequentially deposited using several optional material disposing steps including the third material disposing step in addition to the first and second material disposing steps. In this case, the intermediate drying step can be performed between optional two successive material disposing steps of those material disposing steps.

Additionally, as described above, since function liquid ejected from the ejecting head 1 can penetrate into this porous body (under layer) on the substrate P by transforming the film pattern (under layer) formed on the substrate P to be porous, the amount of ejected liquid droplet can be increased gradually every deposition in the case in which several layers of the function liquid (film pattern) are deposited.

In addition, the first layer (under layer) may be formed of an organosilver compound, and the second (upper layer) may be formed of a silver compound. On the contrary, the first layer may be formed of a silver compound, and the second may be formed of an organosilver compound. Furthermore, on disposing the function liquids on the substrate P in order to form each layer, for example, the function liquid for the first layer may be disposed by a dispenser, and the function liquid for the second layer may be disposed by an ink jet head.

Additionally, although in the above embodiment, the intermediate drying step is performed between the material disposing steps, the step may be performed in parallel with the material disposing steps. For example, the liquid droplets may be disposed on the substrate P simultaneously with heating the substrate P by a heating device (e.g., hot plate and the like), and the other hand, the liquid droplets may be disposed simultaneously with irradiating light. Thereby, thick film patterns can also be realized smoothly. The intermediate drying step may be performed simultaneously with all of the material disposing steps, or some predetermined material disposing steps.

Although in the above embodiment, the function liquid is a dispersed medium in which conductive fine particles are dispersed, a solvent such as diethyleneglycol diethyl ether (dispersion medium) in which conductive materials such as the organosilver compound are dispersed can be used. In this case, in the baking step described above, the heat treatment or a light irradiation treatment is performed on the function liquid (organosilver compound) ejected on the substrate in order to become conductive, and thereby organic components of organosilver compound are removed and the silver particles remain. For example, in order to remove the organic components of organosilver compound, the substrate is baked at about 200° C. Thereby, the dried film after the disposing step is transformed into a conductive film since the electrical contact between the fine particles is secured.

Electro-optical Apparatus

Figure 6:
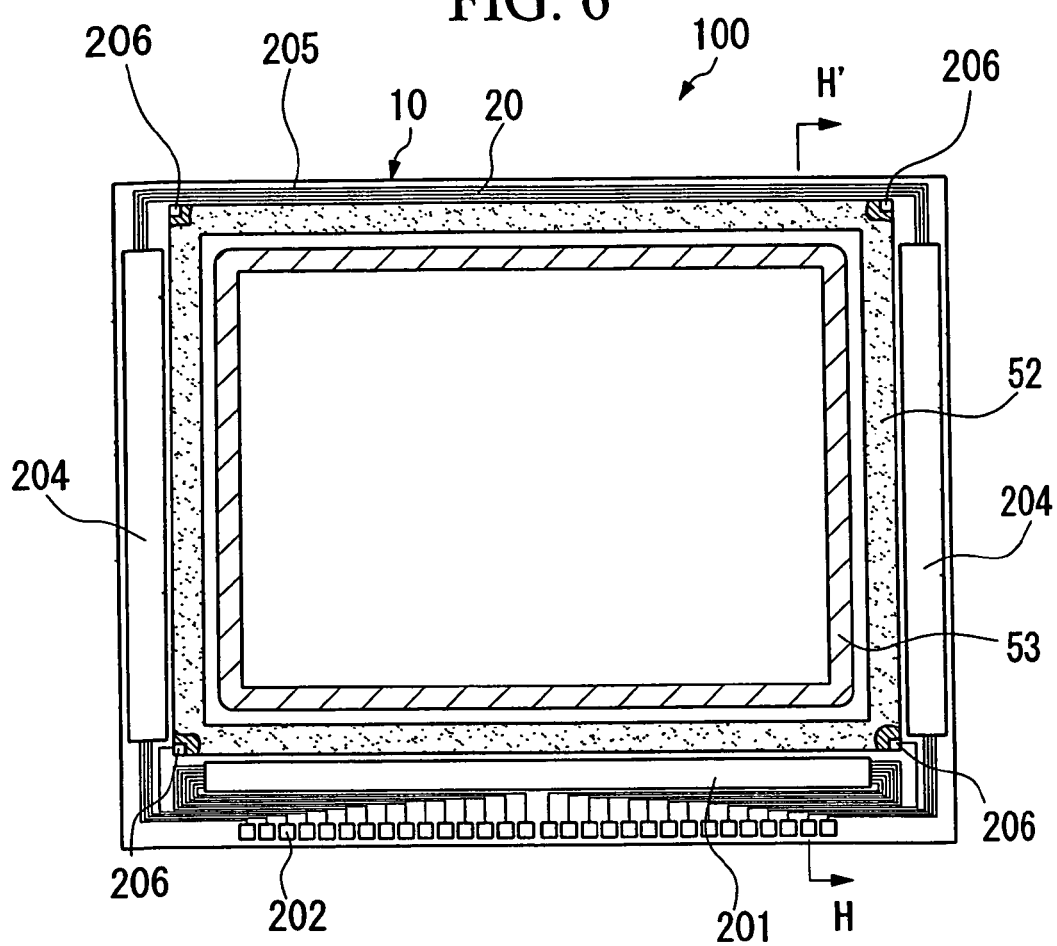
FIG. 6 is a plan view of a liquid crystal display device in view of the opposing substrate side.
Figure 7:
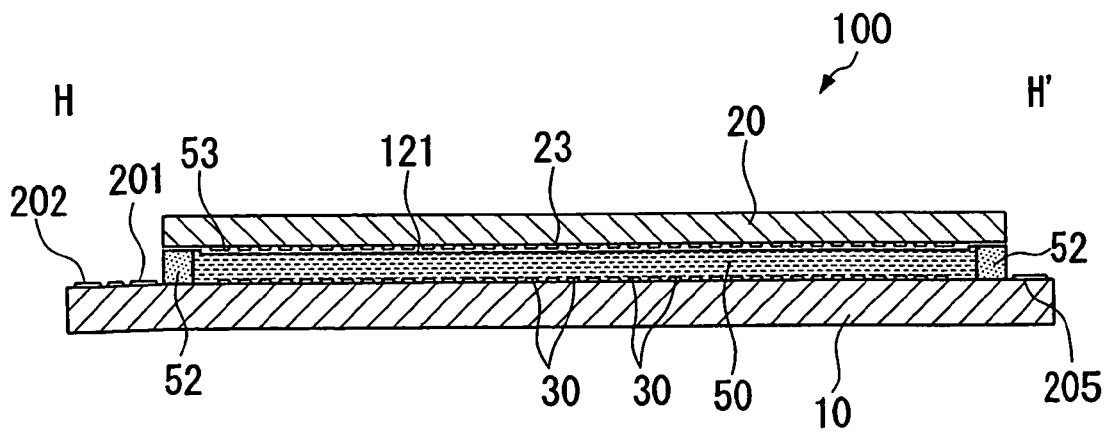
FIG. 7 is a sectional view taken along the line H-H in FIG. 6.
Figure 8:
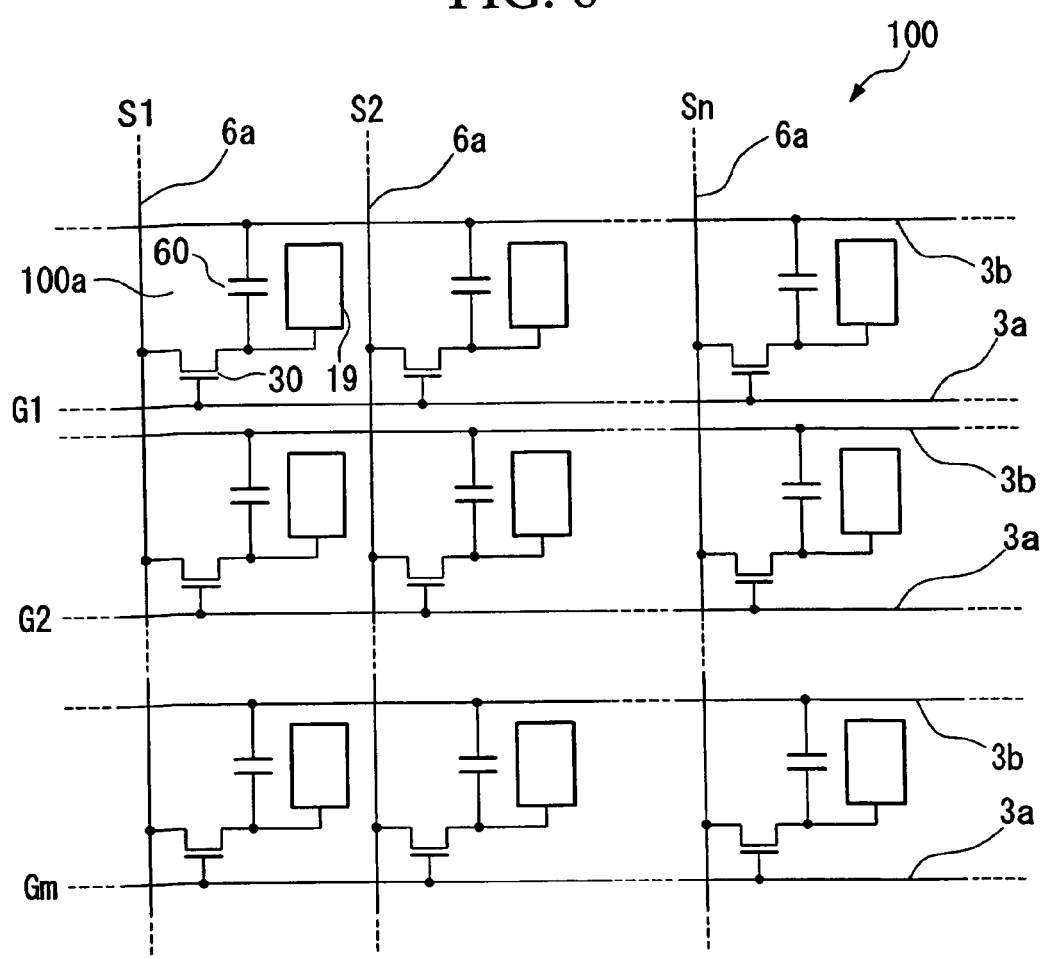
FIG. 8 is an equivalent circuit diagram of the liquid crystal display device.
Figure 9:
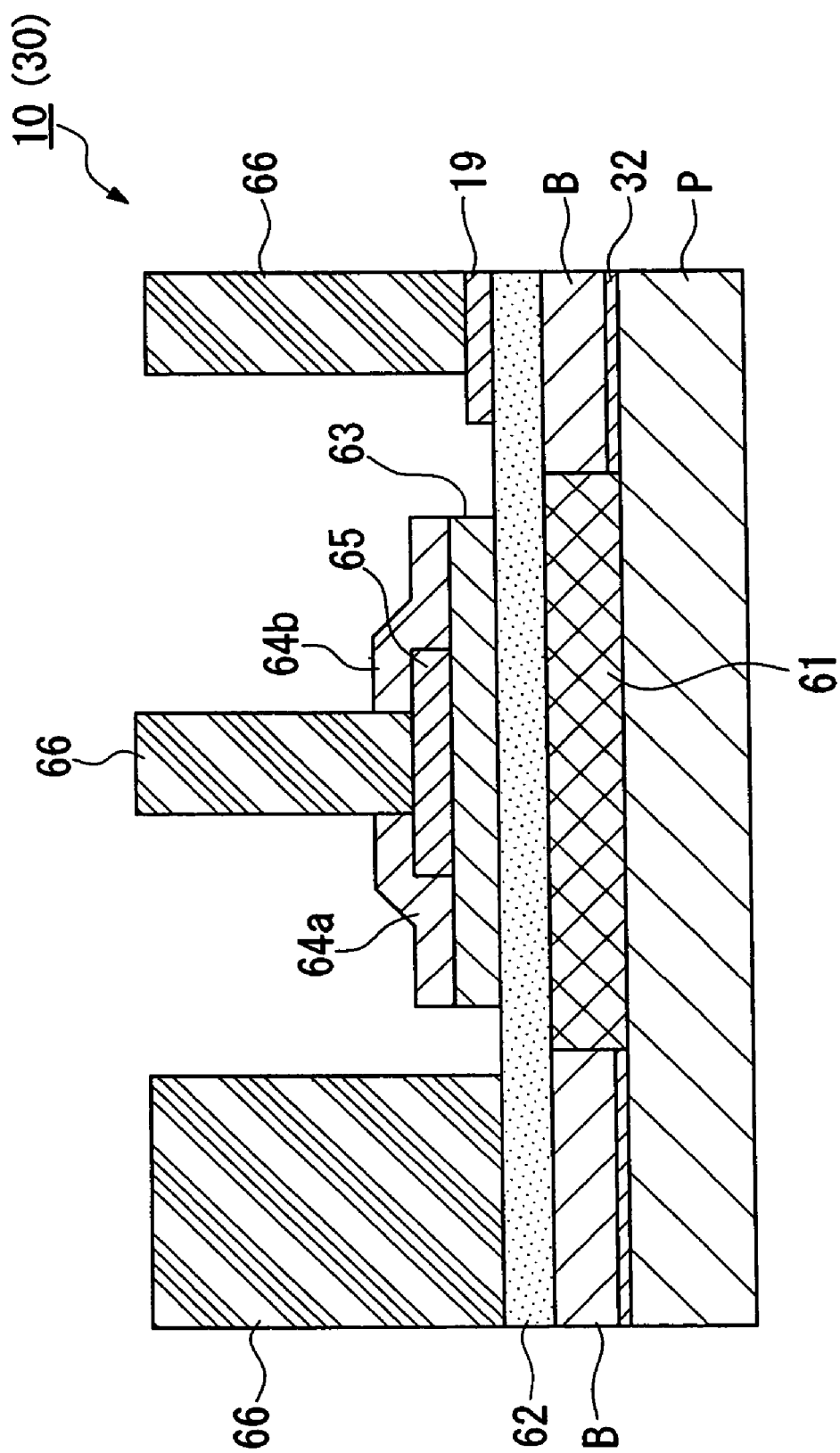
FIG. 9 is a partially enlarged sectional view of the liquid crystal display unit.

A liquid crystal display device which is an example of the electro-optical apparatus of the present invention is described. FIG. 6 is a plan view of the liquid crystal display device according to the present invention in view of an opposing substrate side which is shown with each component. FIG. 7 is a sectional view taken along the line H-H' in FIG. 6. FIG. 8 shows equivalent circuit diagrams such as various devices and lines (wiring) in a plurality of pixels formed in a matrix form in the image display region of the liquid crystal display device. FIG. 9 is a partially enlarged sectional view of the liquid crystal display device. In addition, in respective drawings used for the following explanations, the scale is changed for each layer or each member so as to make each layer and each member of a size can be seen in the drawing.

In FIGS. 6 and 7, in the liquid crystal display device (electro-optical apparatus) 100 of this embodiment, a TFT array substrate 10 and an opposing substrate 20, which make a pair, are adhered with a sealant 52 which is a photo-curing sealing agent. A liquid crystal 50 is enclosed and held in a region partitioned by this sealant 52. The sealant 52 is formed in the shape of a frame which is closed in a region within the substrate surface.

A peripheral parting 53 which consists of a light blocking material is formed in an interior region of the formation region of the sealant 52. In the outer region of the sealant 52, a data line driving circuit 201 and the mounting terminal 202 are formed along one side of the TFT array substrate 10, and a scanning line driving circuit 204 is formed along two sides adjacent to the one side. A plurality of wiring 205 for connecting between the scanning line driving circuits 204 provided in both sides of the image display region is provided in the residual one side of the TFT array substrate 10. In addition, in at least one location of corner sections of the counter substrate 20, an inter-substrate conductive material 206 for electrically connecting between the TFT array substrate 10 and counter substrate 20 is arranged.

In addition, instead of forming the data line driving circuit 201 and scanning line driving circuit 204 on the TFT array substrate 10, for example, it is also sufficient to electrically and mechanically connect a TAB (Tape Automated Bonding) substrate, in which a driving LSI is mounted, with a terminal block, formed in the peripheral part of the TFT array substrate 10, via an anisotropic conductive film. In addition, in the liquid crystal display device 100, a phase difference plate, a polarizing plate, etc., are located in a predetermined direction, depending on the type of the liquid crystal 50 to be used, i.e., the kind of modes of operation such as a TN (Twisted Nematic) mode and a STN (Super Twisted Nematic) mode, and a normally white mode/normally black mode. Nevertheless, they are not shown here in the figures. In addition, in the case of constituting the liquid crystal display device 100 for color display, in the countersubstrate (opposing substrate) 20, color filters of, for example, red (R), green (G), and blue (B) are formed with overcoats for the filters in regions which face respective pixel electrodes of the TFT array substrate 10 described below.

In the image display region of the liquid crystal display device 100 having such a structure, as shown in FIG. 8, while a plurality of pixels 100a is constituted in a matrix form, a TFT 30 for pixel switching (switching device) is formed in each of these pixels 100a. Data lines 6a which supply pixel signals S1, S2, ..., Sn are electrically connected to sources of TFTs 30. The pixel signals S1, S2, ..., Sn written in the data lines 6a may be supplied line by line in this order, or may be supplied for every group which is constituted by a plurality of adjacent data lines 6a. In addition, scanning lines 3a are electrically connected to the gates of TFTs 30, and are constituted so that scanning signal pulses G1, G2, ..., Gm may be applied to the scanning lines 3a line by line in this order in predetermined timing.

Each pixel electrode 19 is electrically connected to a drain of each TFT 30, and makes the TFT 30, which is a switching device, turn on only for a fixed period to write each of the pixel signals S1, S2, ..., Sn supplied from the data lines 6a in each pixel in predetermined timing. Thus, the pixel signals S1, S2, ..., Sn in predetermined level which are written in the liquid crystals via the pixel electrodes 19 are held for a fixed period between the counterelectrodes 121 of the countersubstrate 20 shown in FIG. 7. In addition, in order to prevent the held pixel signals S1, S2, ..., Sn from leaking, storage capacitors 60 are added in parallel to liquid crystal capacitors, each of which is formed between the pixel electrode 19 and counterelectrode (opposing electrode) 121. For example, the voltage of the pixel electrode 19 can be held by the accumulating capacitance 60 by a time period that is hundreds of times longer than the interval that the source voltage is applied. Thereby, the holding property of electric charges improves and the liquid crystal display device 100 with a high contrast ratio can be realized.

FIG. 9 is a partially enlarged sectional view of the liquid crystal display device 100 which has bottom gate TFTs 30, in which gate lines 61 are formed between the banks B and B on the substrate P which constitutes the TTF array substrate 10 by a method for forming line patterns according to the above embodiment.

A semiconductor layer 63 formed of amorphous silicon (a-Si) layer is deposited on the gate line 61 through the intervention of a gate insulating film made of $SiN_x$. A part of the semiconductor layer 63 which faces the gate line is a channel region. On the semiconductor layer 63, connecting layers 64a and 64b, each of which consist of, for example, an n$^+$ type a-Si (amorphous silicon) layer in order to obtain an ohmic junction are stacked or deposited, and, on the semiconductor layer 63 in the center section of the channel region, an insulating etch stop film 65 made of $SiN_x$ for protecting the channel is formed. The gate insulating film 62, the semiconductor layer 63, and the etch stop film 65 are patterned as shown in the figure by depositing (CVD), applying resist, exposing and developing, and photo-etching.

Additionally, the connecting layers 64a, 64b and the pixel electrode 19 made of ITO are patterned by depositing and photo-etching in the same way. The bank 66 is formed in a protruding manner on each of the pixel electrode 19, the gate insulating film 62, and the etch stop film 65, source lines and drain lines are formed between the banks 66 . . . , by ejecting liquid droplets of a silver compound using the above liquid droplet ejecting device IJ.

In the above-mentioned embodiment, although the TFTs 30 are used as switching devices for driving the liquid crystal display device 100, the TFTs 30 is also applicable to, for example, an organic EL (electroluminescence) display device in addition to a liquid crystal display device. An organic EL display device has a structure in which a thin film, including fluorescent inorganic and organic compounds, is sandwiched between a cathode and an anode. In the organic EL display device, excitons are generated by injecting electrons and holes into the above-mentioned thin film, and light is emitted by using the emission of light (fluorescence and phosphorescence) at the time of these excitons recombining. Then, it is possible to manufacture a self-luminescent full-color EL device by patterning materials emitting red, green, and blue light respectively, i.e., luminous layer forming materials, and materials forming hole injection/electron transport layer, as an ink, among the fluorescent materials used for an organic electroluminescent display device, on the substrate having the above-described TFTs 30. Such an organic electroluminescent device is also included in the scope of the device (electro-optical apparatus) according to the present invention.

Figure 10:
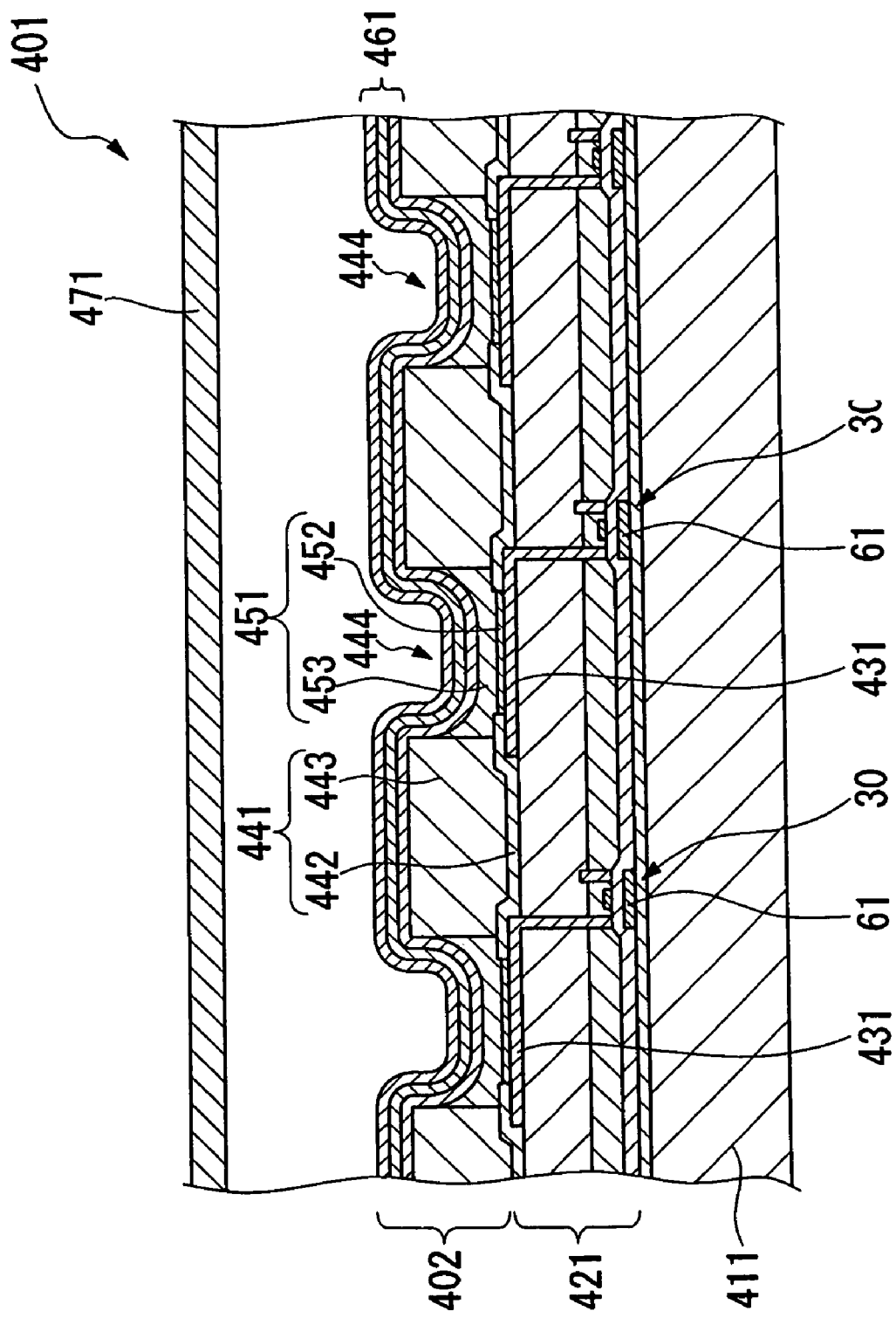
FIG. 10 is a partially enlarged sectional view of an organic EL unit.

FIG. 10 is a sectional side elevation of an organic EL device, some of whose components are manufactured by the above-mentioned liquid droplet ejecting apparatus IJ. The schematic constitution of the organic EL unit will be explained with reference to FIG. 10.

In FIG. 10, an organic electroluminescent apparatus 401 is constituted by connecting wiring of a flexible board (not shown) and a driving IC (not shown) to an organic EL device 402 that includes a substrate 411, a circuit device section 421, pixel electrodes 431, bank sections 441, light emitting devices 451, a cathode 461 (counterelectrode), and a sealing substrate 471. The circuit device section 421 is constituted by forming the TFTs 60, which are active devices, on the substrate 411, and aligning a plurality of pixel electrodes 431 on the circuit device section 421. Then, the gate wiring 61 which constitutes the TFTs 60 is formed by the method for forming a wiring pattern according to the embodiment mentioned above.

Between respective pixel electrodes 431, the bank section 441 is formed in a grid form, and the light emitting device 451 is formed in a concavity opening 444 formed by the bank section 441. In addition, the light emitting device 451 consists of an element which emits red light, and an element which emits green light, and an element which emits blue light, and hence, the organic EL unit 401 achieves the full color display thereby. The cathode 461 is formed all over the bank section 441 and light emitting device 451, and the sealing substrate 471 is stacked on the cathode 461.

The manufacturing process of the organic electroluminescent apparatus 401 including the organic EL device includes a bank section forming step in which the bank sections 441 are formed, a plasma treatment step in order to form adequately the light emitting devices 451, a light emitting device forming step in which the light emitting devices 451 are formed, a counterelectrode forming step in which the cathode 461 is formed, and a sealing step in which the sealing substrate 471 are stacked and encapsulated on the cathode 461.

In the light emitting device forming step, the light emitting device 451 is formed on a concavity opening 444, i.e., the pixel electrode 431, by forming the hole injection layer 452 and a luminous (light emitting) layer 453 and the light emitting device forming step includes a hole injection layer forming step and a luminous layer forming step. Then, the hole injection layer forming step includes a first ejecting step in which a liquid material for forming the hole injection layer 452 is ejected in each pixel electrode 431, and a first drying step in which the ejected liquid object (bit) material is dried and the hole injection layer 452 is formed. In addition, the luminous layer forming step includes a second ejecting step in which a liquid material for forming the luminous layer 453 is ejected on the hole injection layer 452, and a second drying step in which the ejected liquid object material is dried and the luminous layer 453 is formed. In addition, as described above, three kinds of luminous layers 453 are formed respectively by materials corresponding to three colors of red, green, and blue, and hence, the above-mentioned second ejecting step includes three steps so as to eject three kinds of materials, respectively.

In this light emitting device forming step, the above-mentioned liquid droplet ejecting apparatus IJ can be used both at the first ejecting step in the hole injection layer forming step, and the second ejecting step in the luminous layer forming step.

A device (electro-optical apparatus) according to the present invention can be applied to e.g., a PDP (plasma display panel) or a surface-conduction electron-emitter display which utilizes an electron emitting phenomenon caused by applying an electric current to a thin film with a small area, which is formed on a substrate, in parallel to the surface of the film, in addition to the above-mentioned device.

Next, an example, in which film patterns formed by the method for forming film patterns according to the present invention is applied to a plasma display unit.

Figure 11:
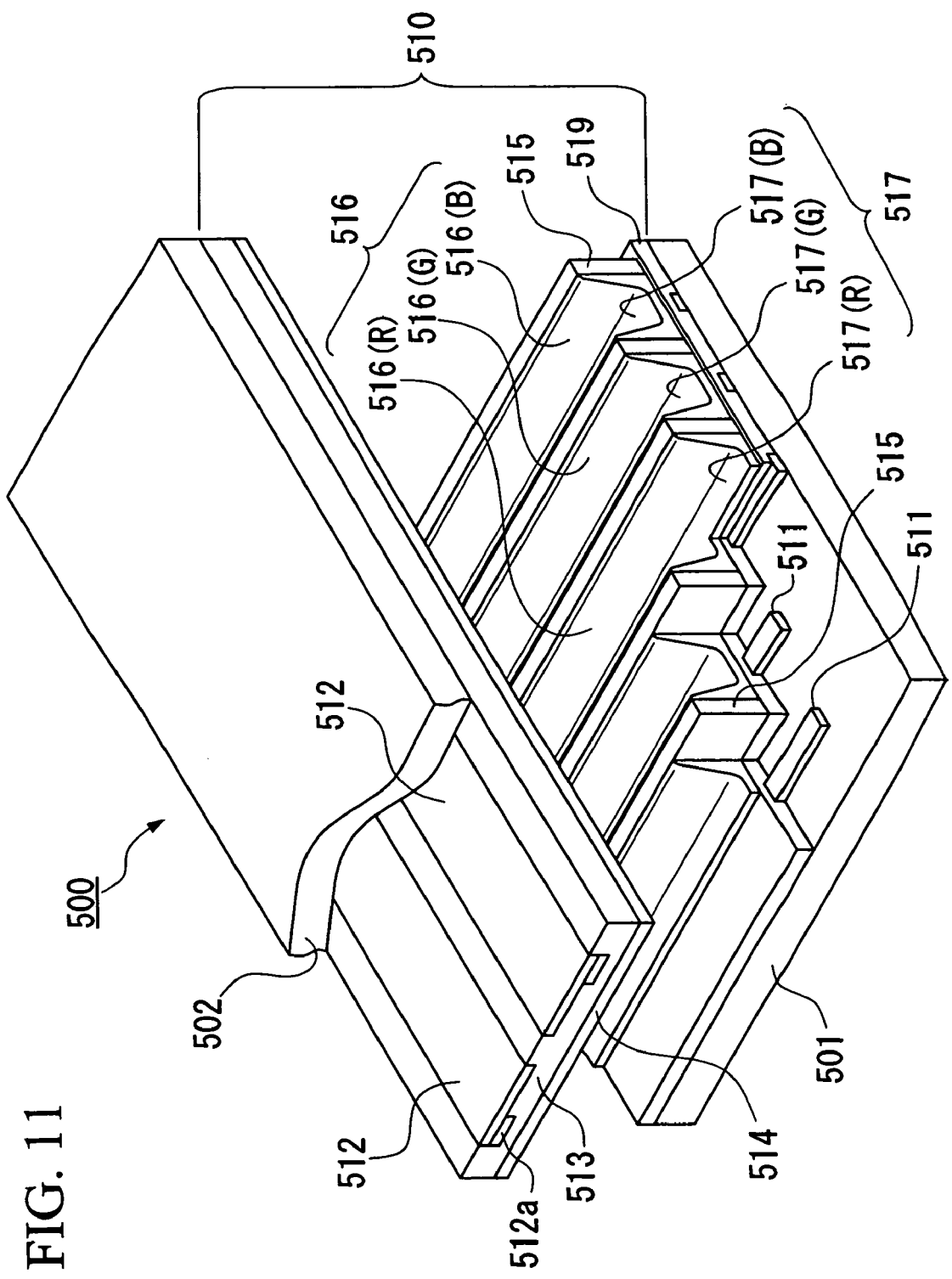
FIG. 11 is an exploded perspective view of a plasma display unit.

FIG. 11 shows an exploded perspective view of the plasma display unit 500 of this embodiment. The plasma display unit 500 is constituted by including substrates 501 and 502 which are located facing each other, and a discharge display section 510 formed therebetween.

The discharge display section 510 is an assembly constituted of a plurality of discharge chambers 516. Three discharge chambers, a red discharge chamber 516 (R), a green discharge chamber 516 (G), and a blue discharge chamber 516 (B), among a plurality of the discharge chambers 516, are arranged so that they constitute a single pixel.

Address electrodes 511 are formed on the top face of a substrate 501 in a stripe form at predetermined intervals.

Furthermore, a dielectric layer 519 is formed so as to cover top faces of the address electrodes 511 and substrate 501. On the dielectric layer 519, partitions 515 are formed so as to be located between the address electrodes 511 and 511 and to run along each address electrode 511. The partition 515 includes partitions adjacent to both of the right and left sides of the address electrode 511 in the width direction, and partitions extended in the direction orthogonal to the address electrode 511. In addition, the discharge chambers 516 are formed corresponding to respective rectangular regions partitioned by the partitions 515.

In addition, a fluorescent substance 517 is located inside each rectangular region partitioned by the partitions 515. Each of the fluorescent substances 517 emits one of red, green, and blue fluorescence. The red fluorescent substance 517 (R), green fluorescent substance 517 (G), and blue fluorescent substance 517 (B) are located on bottoms of the red discharge chamber 516 (R), green discharge chamber 516 (G), and blue discharge chamber 516 (B), respectively.

On the other hand, a plurality of display electrodes 512 is formed at predetermined intervals in a stripe form in the direction orthogonal to the above-mentioned address electrodes 511 on the substrate 502. A dielectric layer 513 and an overcoat 514 made of MgO or the like are formed so as to cover these.

The substrates 501 and 502 are mutually adhered facing each other so as to orthogonally intersect the above-mentioned address electrodes 511, . . . and display electrodes 512, . . . mutually.

The above-mentioned address electrodes 511 and display electrodes 512 are connected to an AC power supply (not shown). Since the fluorescent substances 517 perform excitation luminescence in the discharge display section 510 by turning on electricity to each electrode, color display is possible.

In this embodiment, since the above-mentioned address electrodes 511 and display electrodes 512 are formed on the basis of the above-mentioned method for forming a wiring pattern respectively, it is possible to achieve the miniaturization and thinning and to obtain the high-quality plasma display unit without defects such as a short circuit.

In addition, in the embodiment mentioned above, although the gate wiring of the TFT (thin-film transistor) is formed by using the pattern forming method according to the present invention, it is also possible to produce other components, such as a source electrode, a drain electrode, and a pixel electrode. Hereinafter, a method for producing a TFT will be explained with reference to FIGS. 12 to 15.

Figure 12:
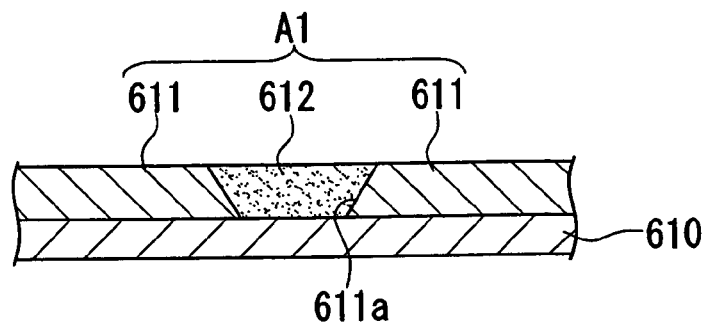
FIG. 12 is a diagram for explaining a step of producing a thin film transistor.

As shown in FIG. 12, a first layer of bank 611 for providing a groove 611a with ½0 to ⅒ of one pixel pitch is first formed on the upper surface of a clean glass substrate 610 using a photolithography method. It is necessary for this bank 611 to have an optical transparency and liquid repellency after the formation, and those suitably used as material therefor are inorganic type materials such as polysilazane in addition to polymeric materials such as an acrylic resin, a polyimide resin, an olefine resin, and a melamine resin.

In order to give liquid repellency to the bank 611 after this formation, it is necessary to perform $CF_4$ plasma treatment (plasma treatment using a gas which has a fluorine component) and the like, but alternatively, the material of the bank 611 itself may be filled with a liquid-repellent component (fluorine group, etc.) beforehand. In this case, $CF_4$ plasma treatment and the like may be omitted.

It is preferable to secure a contact angle of 40° or more for the bank 611, which is made to be liquid-repellent as described above, with reference to the ejected ink, and 10° or less as a contact angle of a glass surface. That is, as a result verified by the present inventors, through experiment, it is possible to secure about 54.0° (10° or less in the case without a treatment) as a contact angle after the treatment to the conductive fine particles (tetra-decane solvent) when an acrylic resin group is adopted as a material of the bank 611. In addition, these contact angles were obtained under the treatment conditions in which a tetrafluoromethane gas of 0.1 L/min was supplied under the plasma power of 550 W.

At the gate scanning electrode forming step (first conductive pattern forming step) following the above-mentioned first layer of the bank forming step, the gate scanning electrode 612 is formed by ejecting liquid droplets including a conductive material using an ink jet so as to fill the inside of the above-mentioned groove 611a which is a drawing area partitioned by the banks 611. Then, when forming the gate scanning electrode 612, the method for forming a pattern according to the present invention is applied.

As a conductive material at this time, Ag, Al, Au, Cu, palladium, Ni, W-Si, a conductive polymer, etc., can be preferably adopted. Thus, since sufficient liquid repellency is imparted to the banks 611 beforehand, the gate scanning electrode 612 formed as described above can be formed in a fine wiring pattern without overflowing from the groove 611a.

A first conductive layer A1 having a flat top face, which consists of the bank 611 and gate scanning electrode 612, is formed on the substrate 610, owing to the above steps.

In addition, in order to obtain the good ejecting result in the groove 511a, as shown in FIG. 12, it is preferable to adopt a semi-tapered shape (tapered shape opening toward the ejecting head) as a shape of this groove 511a. Owing to this, it becomes possible to make the ejected liquid droplets go deep into the groove 511a.

Figure 13:
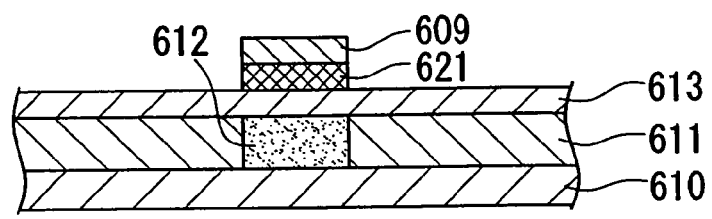
FIG. 13 is a diagram for explaining a step of producing a thin film transistor.

Next, as shown in FIG. 13, continuous depositions of the gate insulating film 613, an active layer 621, and a contact layer 609 are performed by a plasma CVD method. A silicon nitride film as the gate insulating film 613, an amorphous silicon film as the active layer 621, and an n⁺ silicon film as the contact layer 609 are formed by different material gases and plasma conditions, respectively. In the case of forming by the CVD method, heat history of 300 to 350° C. is required, but it is possible to avoid a problem regarding transparency and heat resistance by forming the bank of an inorganic-type material.

Figure 14:
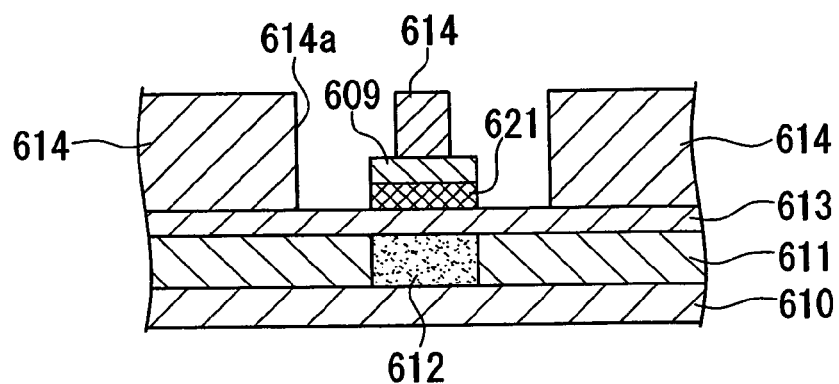
FIG. 14 is a diagram for explaining a step of producing a thin film transistor.

At the bank forming step using the second layer, which follows the above-mentioned semiconductor layer forming step, as shown in FIG. 14, a second layer of bank 614 for providing the groove 614a, which is ½₀ to ⅒ of one pixel pitch and intersects with the above-mentioned groove 611a, is formed on the gate insulating film 613 using a photolithography method. It is necessary for this bank 614 to have optical transparency and liquid repellency after being formed, and those suitably used as material therefor are inorganic type materials such as polysilazane in addition to polymeric materials such as an acrylic resin, a polyimide resin, an olefine resin, and a melamine resin.

In order to give liquid repellency to the bank 614 after this formation, it is necessary to perform $CF_4$ plasma treatment (plasma treatment using a gas which has a fluorine component), etc., but instead of that, the material of the bank 614 itself may be filled with a liquid-repellent component (fluorine group, etc.) beforehand. In this case, $CF_4$ plasma processing, etc., may be omitted.

It is preferable to secure a contact angle of 40° or more for the bank 614, which is reformed to be liquid-repellent as described above, with reference to the ejected ink.

Figure 15:
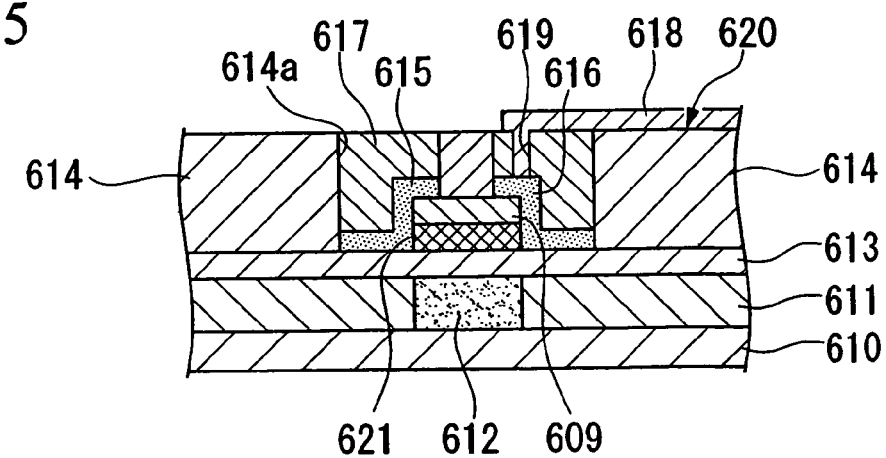
FIG. 15 is a diagram for explaining a step of producing a thin film transistor.

At a source/drain electrode forming step (second conductive pattern forming step) following the bank forming step of the above-mentioned second layer, the source electrode 615 and drain electrode 616, which intersect with the above-mentioned gate scanning electrode 612 as shown in FIG. 15, are formed by ejecting liquid droplets including a conductive material by an ink jet so as to fill the inside of the above-mentioned groove 614a which is a drawing area partitioned by the bank 614. Then, on forming the source electrode 615 and drain electrode 616, the method for forming a pattern according to the present invention is applied.

As a conductive material at this time, Ag, Al, Au, Cu, palladium, Ni, W-Si, a conductive polymer, etc., can be suitably adopted. Thus, since sufficient liquid repellency is imparted to the banks 614 beforehand, the source electrode 615 and drain electrode 616 formed as described above can be formed in a fine wiring pattern without overflowing from the groove 614a.

In addition, an insulator 617 is located so that the groove 514a where the source electrode 615 and drain electrode 616 are located may be filled. A flat top surface 620 consisting of the bank 614 and insulator 617 is formed on the substrate 610 owing to the above steps.

Then, while forming a contact hole 619 in the insulator 617, a pixel electrode (ITO) 618 patterned on the top surface 620 is formed, and the TFT is formed by connecting the drain electrode 616 and pixel electrode 618 via the contact hole 619.

Figure 16:
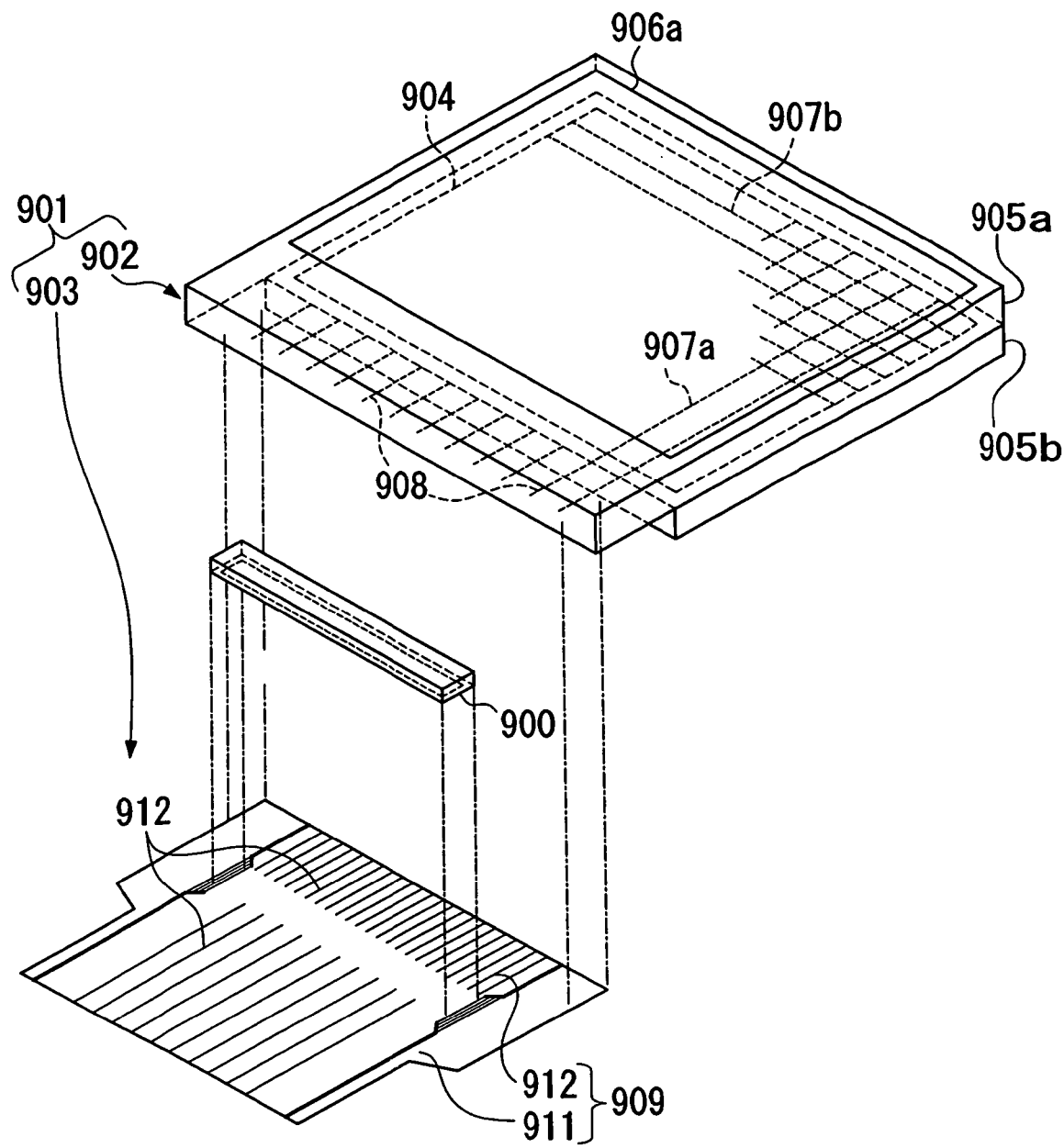
FIG. 16 is a diagram showing another form of a liquid crystal display device.

FIG. 16 is a diagram showing another embodiment of a liquid crystal display device.

A liquid crystal display unit (electro-optical apparatus) 901 shown in FIG. 16 includes a color liquid crystal panel (electro-optical panel) 902, and a circuit substrate 903 connected to the liquid crystal panel 902. In addition, lighting systems such as a back light and other incidental equipment are attached to the liquid crystal panel 902, if necessary.

The liquid crystal panel 902 has a pair of substrates 905a and 905b which are bonded with a sealant 904. In addition, a liquid crystal is enclosed in a gap formed between these substrates 905a and 905b, a so-called cell gap. Generally, these substrates 905a and 905b are formed with a transparent material, for example, glass, a synthetic resin, etc. A polarizing plate 906a and another polarizing plate are adhered on the outside surface of the substrates 905a and 905b. In FIG. 16, the illustration of another polarizing plate is omitted.

In addition, an electrode 907a is formed on the inner surface of the substrate 905a, and an electrode 907b is formed on the inner surface of the substrate 905b. These electrodes 907a and 907b are formed in a proper pattern state such as a stripe shape, characters, and numerals. In addition, these electrodes 907a and 907b are formed, for example, with a transparent material such as ITO (Indium Tin Oxide). The substrate 905a has an overhang section protruding ahead of the substrate 905b, and a plurality of terminals 908 are formed on this overhang section. These terminals 908 are formed concurrently with the electrode 907a when forming the electrode 907a on the substrate 905a. Therefore, these terminals 908 are formed, for example, of ITO. These terminals 908 include one which is extended from and is integral with the electrode 907a, and one connected to the electrode 907b via a conductive material (not shown).

A semiconductor device 900 as a liquid crystal driving IC is mounted in a predetermined position on a wiring board 909 in the circuit board 903. In addition, a resistor, a capacitor, and other chips, which are not shown, may be mounted in predetermined positions of parts other than the part in which the semiconductor device 900 is mounted. The wiring board 909 is produced by forming a wiring pattern 912 by patterning metal films such as a Cu film formed on a flexible base substrate 911 made of e.g., a polyimide.

In this embodiment, the electrodes 907a and 907b in the liquid crystal panel 902, and the wiring pattern 912 in the circuit board 903 is formed by the above-mentioned device production method.

According to the liquid crystal display device of this embodiment, it is possible to achieve the miniaturization and thinning and to obtain the high-quality liquid crystal display device without defects such as a short circuit.

In addition, although the example mentioned above is a passive liquid crystal panel, an active matrix liquid crystal panel can be used. That is, thin-film transistors (TFTs) are formed on one substrate, and a pixel electrode is formed for each TFT. In addition, it is possible to form the wiring (gate wiring, source wiring) electrically connected to each TFT by using ink jet technique as mentioned above. On the other hand, counterelectrodes, etc., are formed on an opposing substrate. The present invention is applicable also to such an active matrix liquid crystal panel.

Figure 17:
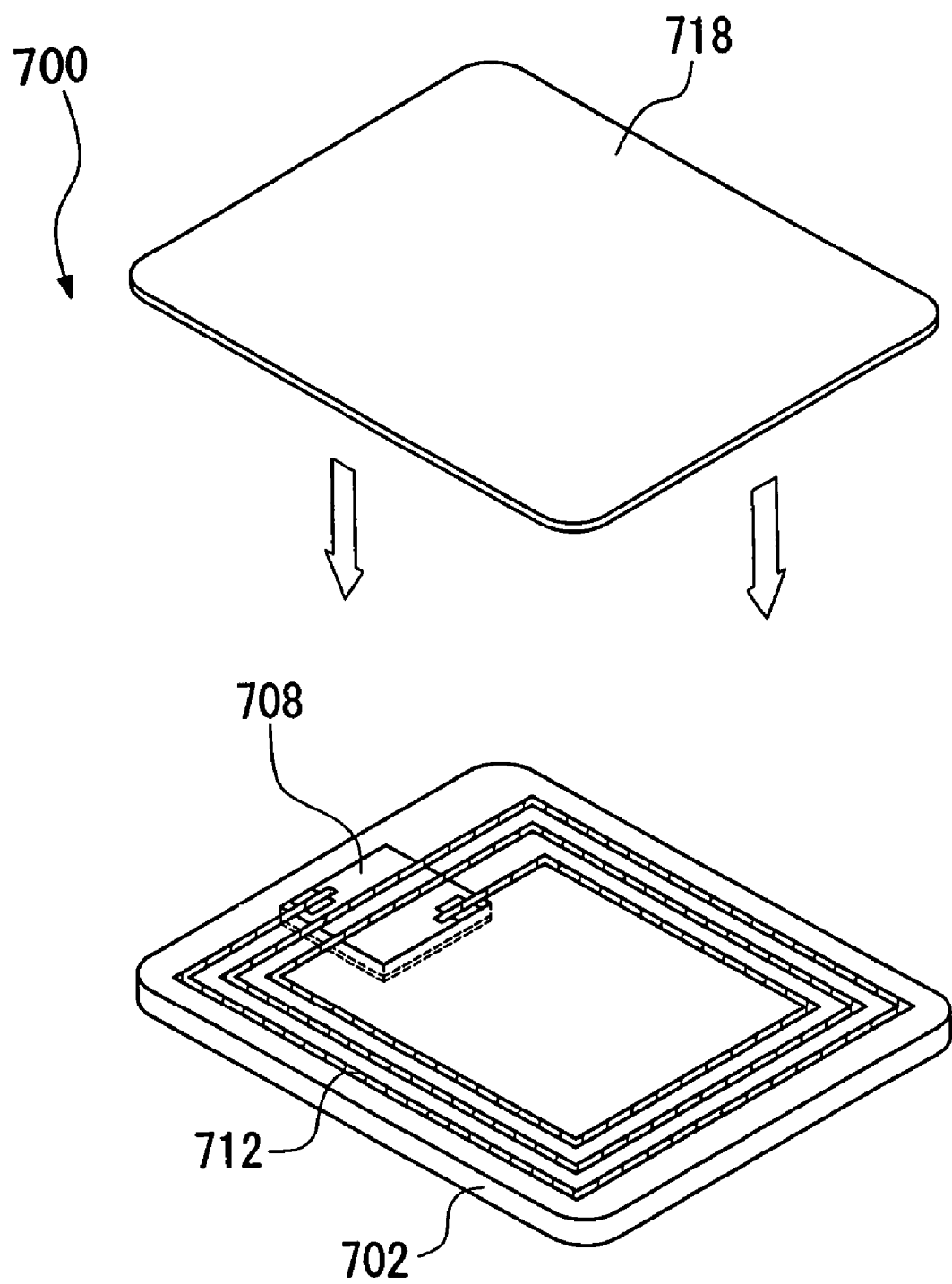
FIG. 17 is an exploded perspective view of a noncontact type card medium.

Next, an embodiment of a noncontact type card medium will be explained as another embodiment. As shown in FIG. 17, a noncontact type card medium (electronic apparatus) 700 according to this embodiment incorporates a semiconductor integrated circuit chip 708 and an antenna circuit 712 into a case consisting of a card base 702 and a card cover 718. At least one of power supply and data transfer is executed by at least one of an electromagnetic wave and electrostatic capacitance coupling with an external transceiver (not shown). In this embodiment, the above-mentioned antenna circuit 712 is formed by the method for forming a wiring pattern according to the above-mentioned embodiment.

A device (electro-optical apparatus) according to the present invention can be applied to, e.g., a PDP (plasma display panel) or a surface-conduction electron-emitter display which utilizes an electron emitting phenomenon caused by applying an electric current to a thin film with a small area, which is formed on a substrate, in parallel to the surface of the film, in addition to the above-mentioned device.

Electronic Apparatus

A specific example of an electronic apparatus of the present invention will be explained.

Figure 18A:
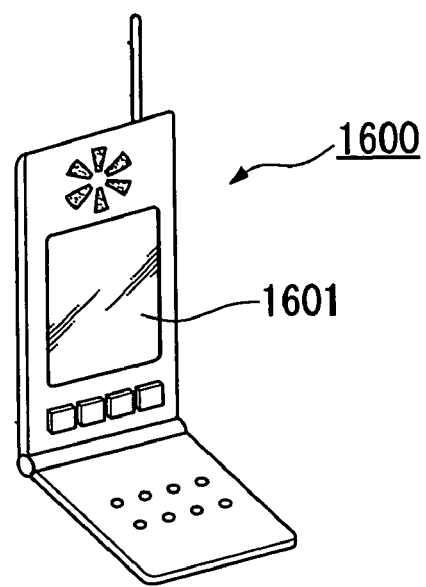
FIGS. 18A to 18C are diagrams showing examples of the electronic apparatus of the present invention.

FIG. 18A is a perspective view showing an example of a cellular phone. In FIG. 18A, reference numeral 1600 denotes a portable telephone body and reference numeral 1601 denotes a liquid crystal display section provided with the liquid crystal display unit of the above-mentioned embodiment.

Figure 18B:
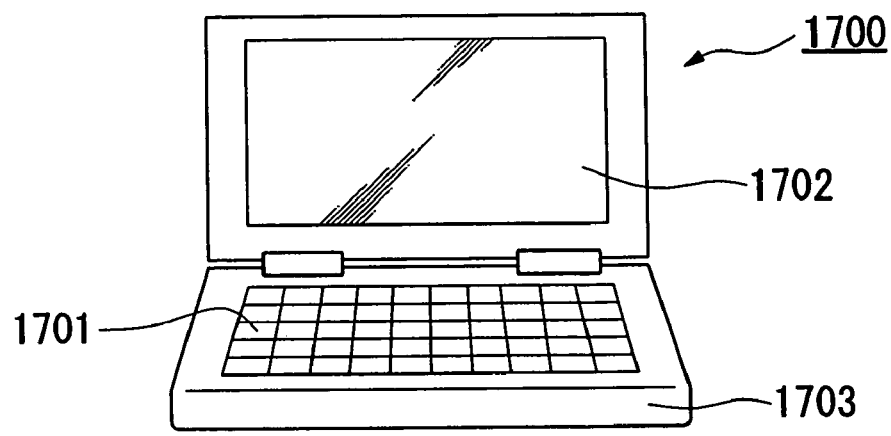

FIG. 18B is a perspective view showing an example of a portable information processing apparatus such as a word processor and a personal computer. In FIG. 18B, reference numeral 1700 denotes an information processing unit, numeral 1701 denotes an input-section such as a keyboard, reference numeral 1703 denotes an information processing unit main body, and reference numeral 1702 denotes a liquid crystal display section provided with the liquid crystal display unit of the above-mentioned embodiment.

Figure 18C:
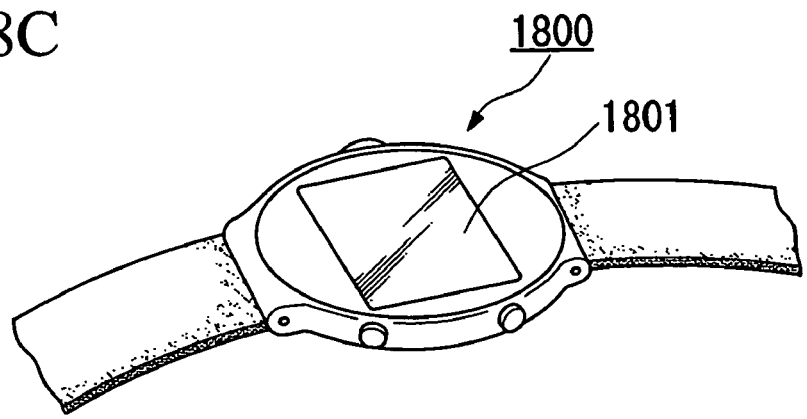

FIG. 18C is a perspective view showing an example of a wristwatch type electronic apparatus. In FIG. 18C, reference numeral 1800 denotes a watch body and reference numeral 1801 denotes a liquid crystal display section provided with the liquid crystal display unit of the above-mentioned embodiment.

Each of the electronic apparatuses shown in FIGS. 18A to 18C includes the liquid crystal display unit of the above-mentioned embodiment, and the wiring patterns with predetermined thickness.

Although the electronic apparatus of this embodiment, which includes a liquid crystal apparatus, is described above, it is also possible to make it an electronic apparatus provided with other electro-optical apparatus such as an organic electroluminescent display unit or a plasma display unit.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

Although the thin film pattern is used as a conductive film in the above-mentioned embodiments, it should be understood that these are exemplary of the invention and are not to be considered as limiting, and the present invention can be applied to, e.g., color filters for color display images in a liquid crystal display device. These color filters can be produced by disposing liquid droplets of ink (liquid material) of R (red), G (green) and B (blue) on a substrate in a predetermined pattern. A liquid crystal display device with high-quality color filters can be manufactured by producing the color filters by forming banks in a predetermined pattern on a substrate, applying liquid repellency to the banks, and disposing the inks.

What is claimed is:

1. A method for fabricating a thin film pattern on a substrate comprising:
    a first material disposing step of disposing first liquid droplets made of a function liquid between banks to form a first pattern;
    a second material disposing step of disposing second liquid droplets made of a function liquid on said first pattern; and
    an intermediate drying step of removing at least a part of a solvent contained in said first liquid droplets so that said function liquid of said first liquid droplets disposed on said substrate is transformed to a porous film pattern between said first material disposing step and said second material disposing step;
    wherein:
        the porous film pattern is a conductive film and acts as a receiving film, and the second liquid droplets are disposed so as to penetrate into the porous pattern and are disposed between the banks; and
        said function liquid of said first liquid droplets and said function liquid of said second liquid droplets include conductive particles, and the conductive particles include one of gold, silver, copper, palladium, and nickel.

2. A method for fabricating a thin film pattern according to claim 1, wherein said intermediate drying step includes a heat treatment process.

3. A method for fabricating a thin film pattern according to claim 1, wherein said intermediate drying step includes a light irradiation treatment process.

4. A method for fabricating a thin film pattern according to claim 1, wherein, after said intermediate drying step, a liquid-repelling process, in which said banks are made to be liquid-repellent, is carried out.

5. A method for fabricating a thin film pattern according to claim 1, wherein said function liquids used in said material disposing steps are mutually different.

6. A method for fabricating a thin film pattern according to claim 1, wherein at least one of said function liquids comprises materials which can express conductivity by heat treatment or light irradiation treatment.

7. A method for manufacturing an active matrix substrate comprising a step of fabricating a thin film pattern on a substrate, wherein said step of fabricating a thin film pattern on a substrate is carried out by a method for fabricating a thin film pattern according to claim 1.

8. A method for manufacturing a device comprising a step of fabricating a thin film pattern on a substrate, wherein said step of fabricating a thin film pattern on a substrate is carried out by a method for fabricating a thin film pattern according to claim 1.

9. A method for fabricating a thin film pattern according to claim 1, further comprising:
a bank forming step of forming banks in a predetermined pattern on said substrate.

10. A method for fabricating a thin film pattern according to claim 1, further comprising a third material disposing step of disposing third liquid droplets made of a function liquid on said function liquid disposed on said substrate, before or after said second material disposing step.

11. A method for fabricating a thin film pattern according to claim 10, wherein said function liquids used in said material disposing steps are mutually different.

12. A method for fabricating a thin film pattern according to claim 10, wherein at least one of said function liquids comprises materials which can express conductivity by heat treatment or light irradiation treatment.

13. A method for fabricating a thin film pattern on a substrate comprising:
a first material disposing step of disposing first liquid droplets made of a function liquid between banks to form a first pattern;
a second material disposing step of disposing second liquid droplets made of a function liquid on said first pattern; and
performing an intermediate drying step of removing at least a part of a liquid component contained in said first liquid droplet so that said function liquid of said first liquid droplets disposed on said substrate is transformed to a porous film pattern in tandem with at least one of said first material disposing step and said second material disposing step;
wherein:
the porous film pattern is a conductive film and acts as a receiving film, and the second liquid droplets are disposed so as to penetrate into the porous pattern and are disposed between the banks; and
said function liquid of said first liquid droplets and said function liquid of said second liquid droplets include conductive particles, and the conductive particles include one of gold, silver, copper, palladium, and nickel.

14. A method for fabricating a thin film pattern according to claim 13, further comprising a third material disposing step of disposing third liquid droplets made of a function liquid on said function liquid disposed on said substrate, before or after said second material disposing step.

15. A method for fabricating a thin film pattern according to claim 13, wherein said intermediate drying step includes a heat treatment process.

16. A method for fabricating a thin film pattern according to claim 13, wherein said intermediate drying step includes a light irradiation treatment process.

17. A method for fabricating a thin film pattern according to claim 13, wherein, after said intermediate drying step, a liquid-repelling process, in which said banks are made to be liquid-repellent, is carried out.

18. A method for fabricating a thin film pattern according to claim 13, wherein said function liquids used in said material disposing steps are mutually different.

19. A method for fabricating a thin film pattern according to claim 13, wherein at least one of said function liquids comprises materials which can express conductivity by heat treatment or light irradiation treatment.

20. A method for manufacturing an active matrix substrate comprising a step of fabricating a thin film pattern on a substrate, wherein said step of fabricating a thin film pattern on a substrate is carried out by a method for fabricating a thin film pattern according to claim 13.

21. A method for manufacturing a device comprising a step of fabricating a thin film pattern on a substrate, wherein said step of fabricating a thin film pattern on a substrate is carried out by a method for fabricating a thin film pattern according to claim 13.

22. A method for fabricating a thin film pattern according to claim 13, further comprising:
a bank forming step of forming banks in a predetermined pattern on said substrate.

23. A method for manufacturing an active matrix substrate, comprising:
a first step of forming gate lines on a substrate;
a second step of forming a gate insulating film on said gate lines;
a third step of depositing a semiconductor layer on said gate lines through the intervention of said gate insulating film;
a fourth step of forming source electrodes and drain electrodes on said gate insulating film;
a fifth step of disposing insulating materials on said source electrodes and said drain electrodes; and
a sixth step of forming pixels electrodes with an electrical connection to said drain electrodes;
wherein:
at least one of said first step, said fourth step, and said sixth step includes a first material disposing step of disposing first liquid droplets made of a function liquid between banks to form a first pattern, a second material disposing step of disposing second liquid droplets made of a function liquid on said first pattern, and an intermediate drying step of removing at least a part of a solvent included in said first liquid droplets so that said function liquid of said first liquid droplets disposed on said substrate is transformed to a porous film pattern between said first material disposing step and said second material disposing step;
the porous film pattern is a conductive film and acts as a receiving film, and the second liquid droplets are disposed so as to penetrate into the porous pattern and are disposed between the banks; and
said function liquid of said first liquid droplets and said function liquid of said second liquid droplets include conductive particles, and the conductive particles include one of gold, silver, copper, palladium, and nickel.

24. A method for manufacturing an active matrix substrate according to claim 23, wherein:
at least one of said first step, said fourth step, and said sixth step includes a step of forming the banks depending on a formation pattern.

25. A method for manufacturing an active matrix substrate comprising:
a first step of forming gate lines on a substrate;
a second step of forming a gate insulating film on said gate lines;
a third step of depositing a semiconductor layer on said gate lines through the intervention of said gate insulating film;
a fourth step of forming source electrodes and drain electrodes on said gate insulating film;
a fifth step of disposing insulating materials on said source electrodes and said drain electrodes; and
a sixth step of forming pixels electrodes with an electrical connection to said drain electrodes;
wherein:
at least one of said first step, said fourth step, and said sixth step includes a first material disposing step of disposing first liquid droplets made of a function liquid between banks to form a first pattern, a second material disposing step of disposing second liquid droplets made of a function liquid on said first pattern, and performing an intermediate drying step of removing at least a part of a liquid component included in said first liquid droplet so that said function liquid of said first liquid droplets disposed on said substrate is transformed to a porous film pattern in tandem with at least one of said first material disposing step and said second material disposing step;
the porous film pattern is a conductive film and acts as a receiving film, and the second liquid droplets are disposed so as to penetrate into the porous pattern and are disposed between the banks; and
said function liquid of said first liquid droplets and said function liquid of said second liquid droplets include conductive particles, and the conductive particles include one of gold, silver, copper, palladium, and nickel.

26. A method for manufacturing an active matrix substrate according to claim 25, wherein:
at least one of said first step, said fourth step, and said sixth step includes a step of forming the banks depending on a formation pattern.

* * * * *